(12) United States Patent
Kozawa et al.

(10) Patent No.: US 7,820,367 B2
(45) Date of Patent: Oct. 26, 2010

(54) RESIST PATTERN THICKENING MATERIAL AND PROCESS FOR FORMING RESIST PATTERN, AND SEMICONDUCTOR DEVICE AND PROCESS FOR PRODUCING THE SAME

(75) Inventors: Miwa Kozawa, Kawasaki (JP); Koji Nozaki, Kawasaki (JP); Takahisa Namiki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 322 days.

(21) Appl. No.: 11/045,430

(22) Filed: Jan. 31, 2005

(65) Prior Publication Data

US 2006/0073419 A1 Apr. 6, 2006

(30) Foreign Application Priority Data

Oct. 4, 2004 (JP) .............................. 2004-291910

(51) Int. Cl.
G03F 7/26 (2006.01)
G03F 7/40 (2006.01)

(52) U.S. Cl. ..................... 430/322; 430/311; 430/331

(58) Field of Classification Search .............. 430/270.1, 430/311, 320, 325, 326, 331, 312, 313, 322, 430/323; 438/758, 761
See application file for complete search history.

(56) References Cited

U.S. PATENT DOCUMENTS

| | | | | |
|---|---|---|---|---|
| 4,770,989 A | * | 9/1988 | Komamura et al. | 430/553 |
| 6,153,349 A | * | 11/2000 | Ichikawa et al. | 430/170 |
| 6,180,320 B1 | | 1/2001 | Saito et al. | |
| 6,187,084 B1 | * | 2/2001 | Bradbury et al. | 106/31.5 |
| 6,555,607 B1 | | 4/2003 | Kanda et al. | 524/366 |
| 6,579,657 B1 | | 6/2003 | Ishibashi et al. | 430/270 |
| 6,949,325 B2 | * | 9/2005 | Li et al. | 430/270.1 |
| 7,008,748 B1 | * | 3/2006 | Hasberg et al. | 430/139 |
| 7,399,582 B2 | | 7/2008 | Takahashi et al. | |
| 2001/0031436 A1 | * | 10/2001 | Lelental et al. | 430/619 |
| 2003/0087192 A1 | * | 5/2003 | Gau et al. | 430/311 |
| 2003/0157801 A1 | * | 8/2003 | Kozawa et al. | 438/689 |
| 2004/0012663 A1 | * | 1/2004 | Takashima et al. | 347/100 |
| 2004/0121259 A1 | | 6/2004 | Kozawa et al. | |
| 2004/0137377 A1 | * | 7/2004 | Shinbori et al. | 430/325 |
| 2004/0241569 A1 | * | 12/2004 | Chen et al. | 430/176 |
| 2006/0160015 A1 | * | 7/2006 | Takano et al. | 430/270.1 |
| 2008/0044759 A1 | | 2/2008 | Ishibashi et al. | |

FOREIGN PATENT DOCUMENTS

| | | |
|---|---|---|
| EP | 1429185 A1 | 6/2004 |
| JP | 5-197151 | 8/1993 |
| JP | 10-73927 | 3/1998 |
| JP | 11-204399 | 7/1999 |
| JP | 2000-35672 | 2/2000 |
| JP | 2000-267268 | 9/2000 |
| JP | 2000-347414 | 12/2000 |
| JP | 2001-19860 | 1/2001 |
| JP | 2001-33984 | 2/2001 |
| JP | 2001-228616 | 8/2001 |
| JP | 2001-281886 | 10/2001 |
| JP | 2002-6491 | 1/2002 |
| JP | 2002-6512 | 1/2002 |
| JP | 2002-49161 | 2/2002 |
| JP | 2003-84457 | 3/2003 |
| JP | 2003-131400 | 5/2003 |
| JP | 2004-077951 A | 3/2004 |
| JP | 200664851 A | 3/2006 |
| WO | WO 03/040831 * | 5/2003 |
| WO | WO 2004/074941 * | 9/2004 |
| WO | 2005008340 A1 | 1/2005 |

OTHER PUBLICATIONS

Korean Office Action dated Jun. 15, 2006, issued in corresponding KR Application No. 10-2005-0008440.
Korean Office Action dated Sep. 13, 2007.
Japanese Office Action dated Dec. 22, 2009 (mailing date), issued in corresponding Japanese Patent Application No. 2004-291910.

* cited by examiner

Primary Examiner—Cynthia H Kelly
Assistant Examiner—Anca Eoff
(74) Attorney, Agent, or Firm—Westerman, Hattori, Daniels & Adrian, LLP

(57) ABSTRACT

The object of the present invention is to provide a process for forming a resist pattern that is capable to utilize excimer laser beam, the thickening level of the resist pattern is controllable uniformly, constantly and precisely, without being affected substantially by environmental changes such as temperatures and humidity, and storage period, and space pattern of resist may be formed with a fineness exceeding exposure limits or resolution limits of available irradiation sources. The process for producing a semiconductor device is characterized in that forming a resist pattern on a surface of workpiece, coating a resist pattern thickening material on the resist pattern, thickening the resist pattern to form a thickened resist pattern, and patterning the surface of workpiece by etching using the thickened resist pattern as a mask, wherein the resist pattern thickening material comprises a resin, and exhibits a pH value of above 7 and not over 14 at coating or after coating on the resist pattern.

8 Claims, 16 Drawing Sheets

Thickening of Resist Pattern

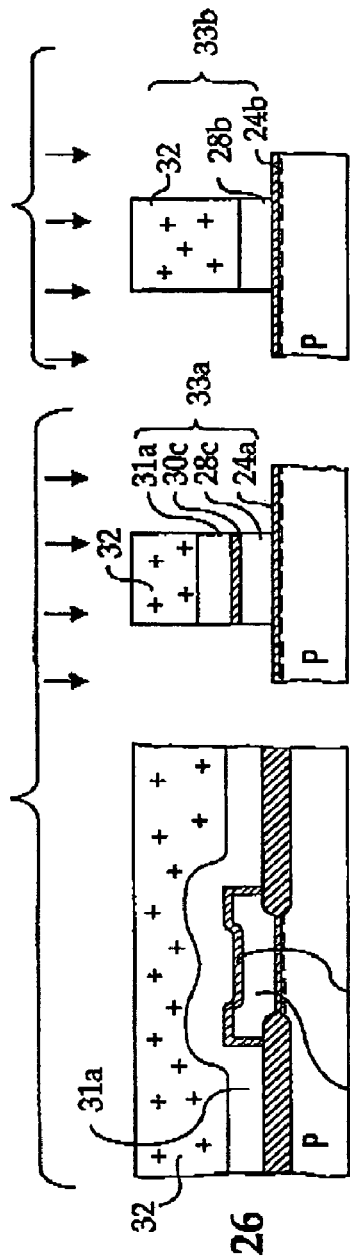
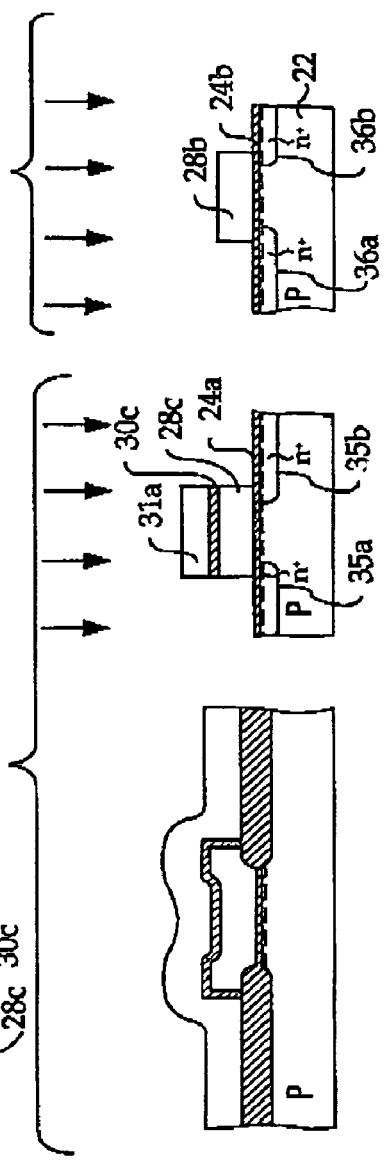
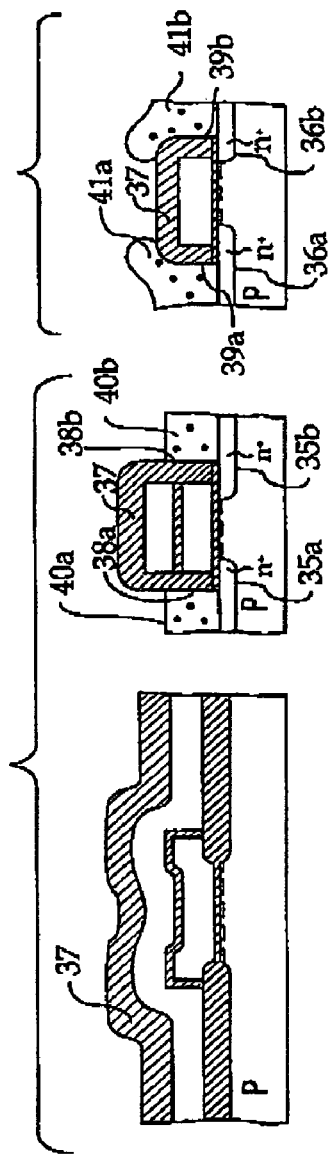
FIG. 26
FIG. 27
FIG. 28

RESIST PATTERN THICKENING MATERIAL AND PROCESS FOR FORMING RESIST PATTERN, AND SEMICONDUCTOR DEVICE AND PROCESS FOR PRODUCING THE SAME

CROSS-REFERENCE TO RELATED APPLICATIONS

This application is based upon and claims the benefits of the priority from the prior Japanese Patent Application No. 2004-291910, filed on Oct. 4, 2004, the entire contents of which are incorporated herein by reference.

BACKGROUND OF THE INVENTION

1. Field of the Invention

The present invention relates to a resist pattern thickening material, which is applied over a resist pattern and is capable of thickening the resist pattern, and which may form a fine space pattern that exceeds exposure limit of laser beam or light of available exposure devices. The present invention also relates to a process for forming a resist pattern, a semiconductor device, and a process for producing the semiconductor device that utilize the resist pattern thickening material respectively.

2. Description of the Related Art

Currently, semiconductor integrated circuits have been progressed into finer and more precise integration, and LSIs and VLSIs are utilized commercially. Along with these trends, the wiring patterns extend to regions of 200 nm or less, in particular cases extend to regions as low as 100 nm or less. Lithographic technologies are extremely important for forming fine wiring patterns, in which a substrate is coated by a resist film, then is selectively exposed, and then is developed to form a resist pattern. Typically, dry etching is carried out by using resist patterns as a mask, and desired patterns are produced by removing the resist patterns.

In order to improve such wiring patterns utilizing the lithographic technologies, it is necessary to make the light or beam from exposure devices shorter wavelength and also to develop resist materials that are of high resolution and are suitable to the irradiation source. However, in order to make light or beam from an exposure device shorter wavelength, time consuming and expensive researches are required. Further, the developments of new resist materials are not easy that are utilized for exposing light or beam with shorter wavelength.

Accordingly, various technologies have been proposed to form fine resist patterns by means of resist pattern thickening materials in order to form finer patterns.

For example, Japanese Patent Application Laid-Open (JP-A) No. 10-73927 disclose a proposal that forms fine space patterns using KrF (krypton fluoride) excimer laser beam of wavelength 248 nm which is deep ultraviolet light as the exposure light of a resist. In this proposal, resist patterns are formed by exposing a resist of positive resist or negative resist using KrF excimer laser beam of wavelength 248 nm as the exposure light. Thereafter, by means of a water-soluble resin composition, a coated film is provided so as to cover the resist pattern. The coated film and the resist pattern are made to interact at the interface thereof using the residual acid within the material of the resist pattern, and the resist pattern is thickened (hereinafter, the thickening of the resist pattern being sometimes referred to as "swelling"). In this way, the distance between the resist patterns is shortened, and a fine pattern is formed that has the same form as the space pattern.

This proposal makes use of residual acid in the resist pattern to thicken the resist pattern through acid-based reactions, therefore suffers from significant alternation of thickened level due to the environmental conditions such as temperature, alkaline contamination, and other conditions, resulting in hardly controllable thickened level.

JP-A No. 2001-33984 proposes coating basic organic films on negative-type resist patterns that contain acid components, then heating and irradiating. In this proposal, there exist some disadvantages that the resist patterns are limited to negative-type; the process is complicated such that optical irradiation is necessary after the basic organic film is coated; the basic organic film is utilized for no more than making soluble the hydroxy oxide group in phenol compounds in the negative-type resist patterns.

JP-A No. 2002-6512 proposes coating the surface of positive-type resist patterns containing acid components by a first overlay containing acid components and then a second overlay, followed by heating and optical irradiation, thereby making slim the resist pattern without changing the film thickness of the positive-type resist pattern. However, this proposal suffers from the complicated process in that it requires two overlays on the resist pattern.

From the view point to form fine wiring patterns, laser beam having a wave length shorter than 248 nm of KrF excimer laser is desirable such as ArF (argon fluoride) excimer laser having a wave length of 193 nm. On the other hand, pattern formation by means of X-ray, electron beam or the like having a wave length shorter than 193 nm of ArF excimer laser inevitably leads to higher cost and lower productivity, therefore, employment of the ArF excimer laser is desirable.

In the case of fine space pattern formed by resist patterns such as the ArF resist, about a few tens nano meters (nm) is sufficient level to thicken or swell. Thickening over desired level may possibly bring about a desirable result; in some cases, no more than mere improvement as to edge roughness of resist patterns may bring about a sufficient result.

However, in the prior art, the level of thickening or swelling is hardly controllable with respect to resist patters, thus fine patterns are hardly obtainable under delicate controls in general. Further, the prior art typically suffers from significantly unstable thickening or swelling level; the levels of thickening or swelling may be different depending on the irradiating pattern in the prior art; for example, independent rectangular patterns tend to result in larger thickening or swelling level in longer direction than that in shorter direction; hole patterns tend to result in various thickening or swelling levels depending on the pattern density; and/or the level of thickening or swelling often differs depending on the pattern site on a wafer.

Moreover, conventional resist pattern thickening materials are not sufficient in storage stability, there may arise a problem that the thickening level is different depending on the storage period, which cause an undesirable problem in order to apply to processes for producing semiconductors.

Accordingly, an object of the present invention is to provide a resist pattern thickening material that may exhibit superior storage stability and may thicken a resist pattern uniformly, constantly and precisely, without being affected substantially by environmental changes such as temperatures and humidity, and storage period.

Another object of the present invention is to provide a process for forming a resist pattern that is capable to utilize excimer laser beam, the thickening level of the resist pattern is controllable uniformly, constantly and precisely, without being affected substantially by environmental changes such as temperatures and humidity, and storage period, and space pattern of resist may be formed with a fineness exceeding exposure limits or resolution limits of available irradiation sources.

Another object of the present invention is to provide a semiconductor device having a fine wiring pattern that is formed by means of a fine space pattern of resist that is formed by means of the resist pattern thickening material according to the present invention, and a process for producing a semiconductor device adapted to effective mass production of the semiconductor device.

SUMMARY OF THE INVENTION

Inventors of the present invention have investigated vigorously in order to solve the problems described above, and have found the following experiences or discoveries. In the process to thicken resist patterns by coating a resist pattern thickening material or swelling material on the resist pattern, when the resist pattern is thickened through acid-based reactions by making use of residual acid in the resist pattern as disclosed in JP-A No. 10-73927, the thickening level depends significantly on environment factors such as temperature and alkaline contamination thus is hardly controllable in general. On the other hand, when making use of a reaction that does not require an acid to thicken the resist pattern, formation of fine patterns can be stably realized in a condition that acid-based reactions cannot progress. Further, although some components such as polyvinylacetal resin in the resist pattern thickening material may yield a free acid during a prolonged storage, if the free acid can be neutralized, the resist pattern thickening material may serve as a material that provides superior storage stability and process uniformity and consistency without causing change or degrade of the desirable properties during the storage.

The present invention is based on such experiences or discoveries; how to solve aforesaid problems is described in attached claims.

The resist pattern thickening material according to the present invention is utilized to thicken a resist pattern by coating on the resist pattern, comprises a resin, and have a pH value of above 7 and not over 14 at coating on the resist pattern or after the coating on the resist pattern.

When the resist pattern thickening material is applied over a resist pattern to be thickened, the portions of the applied resist pattern thickening material in a vicinity of the interface with the resist pattern to be thickened infiltrate into the resist pattern and cause an interaction, i.e., mixing, with the material of the resist pattern to be thickened. Then, because the affinity is high between the resist pattern thickening material and the resist pattern to be thickened, a surface layer or mixing layer, where the resist pattern thickening material and the resist pattern are mixed, is efficiently formed on the surface of the resist pattern as the inner layer. As a result, the resist pattern to be thickened is efficiently thickened by the resist pattern thickening material. The resist pattern thickened in this way (hereinafter sometimes referring to as "swelled") may be thickened uniformly by the resist pattern thickening material. Thus, the space pattern of resist formed by the thickened resist pattern may display a finer structure that exceeds an exposure limit or resolution limit by leaser beam. The term "space pattern" is hereby defined as a hole, groove, recess, or any other empty space that is formed by developing a resist.

The resist pattern thickening material according to the present invention exhibits a pH value of above 7 and not over 14 at coating on the resist pattern or after the coating on the resist pattern. Accordingly, the resist pattern thickening material and the resist pattern may be interacted by a reaction in which acid does not intervene (hereinafter, the reaction being sometimes referred to as "non-acid reaction"), that is, the resist pattern thickening material and the resist pattern may be interacted under other than acid-based reaction that tends to provide unstable factors. Consequently, uniform thickening effect may be derived without being affected by species or sizes of the resist pattern, and the resist pattern thickening material of the present invention may be suitably utilized for forming a resist pattern, such as a line-space pattern, on a wiring layer of LOGIC LSI where various sizes of resist patterns are utilized.

The process for forming a resist pattern according to the present invention is characterized in that the resist pattern thickening material is coated on the resist pattern and the resist pattern is thickened.

In the process for forming a resist pattern according to the present invention, after a resist pattern to be thickened is formed, the resist pattern thickening material of the present invention is applied so as to cover the surface of the resist pattern and the resist pattern is thickened. In the process for forming a resist pattern, when the resist pattern thickening material is applied over a resist pattern, the portions of the applied resist pattern thickening material in a vicinity of the interface with the resist pattern to be thickened infiltrate into the resist pattern and cause an interaction or mixing with the material of the resist pattern. Thus, at the surface of the resist pattern, the resist pattern thickening material and the resist pattern undergo interaction, and the resist pattern to be thickened is thickened to form a surface layer or mixing layer. At this stage, the resist pattern thickening material according to the present invention exhibits a pH value of above 7 and not over 14 ($7 < pH \leq 14$) at coating on the resist pattern or after the coating on the resist pattern. Accordingly, the resist pattern thickening material and the resist pattern may be interacted by aforesaid non-acid reaction without the acid-based reaction that provides unstable factors. Consequently, uniform thickening effect may be derived without being affected by species or sizes of the resist pattern, thus the resist pattern thickening material according to the present invention can be suitably utilized for forming a resist pattern. The resist pattern, which is formed in this way, has been uniformly thickened by the resist pattern thickening material. Thus, the space pattern formed by the resist pattern exceeds an exposure limit or resolution limit and has a finer structure, and may be applied to the production of semiconductor devices and the like.

The process for producing a semiconductor device according to the present invention is characterized in that it comprises forming a resist pattern on a surface of workpiece, coating the resist pattern thickening material according to the present invention thereby to thicken the resist pattern and to form a thickened resist pattern, thereafter patterning the surface of workpiece by an etching process using the thickened resist pattern as a mask.

In the process for producing a semiconductor device according to the present invention, formation of a thickened resist pattern is carried out by forming a resist pattern on a surface of workpiece to be provided with a wiring pattern for example, then coating the resist pattern thickening material on the resist pattern, thereby the resist pattern is thickened to form a thickened resist pattern. Namely, when the resist pattern thickening material according to the present invention is coated on the resist pattern, the portions of the applied resist pattern thickening material in a vicinity of the interface with the resist pattern infiltrate into the resist pattern and cause an interaction or mixing with the material of the resist pattern. Thus, at the surface of the resist pattern to be thickened, the resist pattern thickening material and the resist pattern undergo interaction, and the resist pattern to be thickened is thickened to form a surface layer or mixing layer. At this stage, the resist pattern thickening material according to the present invention exhibits a pH value of above 7 and not over 14 ($7<pH\leqq14$) at coating on the resist pattern or after the coating on the resist pattern. Accordingly, the resist pattern thickening material and the resist pattern may be interacted by the non-acid reaction without the acid-based reaction that provides unstable factors. Consequently, uniform thickening effect may be derived without being affected by species or sizes of the resist pattern, and the resist pattern thickening material according to the present invention is suitably utilized for forming a resist pattern. The resist pattern, which is formed in this way, has been uniformly thickened by the resist pattern thickening material. Thus, the space pattern formed by the resist pattern exceeds an exposure limit or resolution limit and has a finer structure.

In patterning, etching is carried out by means of the thickened resist pattern formed by the process of thickening a resist pattern; therefore, the surface of workpiece can be patterned finely and precisely with accurate dimension, thus high-quality and high performance semiconductor devices can be produced efficiently having a wiring pattern with fine, precise, and accurate dimension.

The semiconductor device according to the present invention may be produced by the process for producing a semiconductor device according to the present invention, thereby having fine and accurate patterns of wiring patterns for example, and being high quality and high performance.

BRIEF DESCRIPTION OF THE DRAWINGS

FIG. 26 is a cross-sectional schematic diagram for explaining a process for producing the FLASH EPROM which is an example of the process for producing a semiconductor device according to the present invention, and showing a step after the step shown in FIG. 25.

FIG. 27 is a cross-sectional schematic diagram for explaining a process for producing the FLASH EPROM which is an example of the process for producing a semiconductor device according to the present invention, and showing a step after the step shown in FIG. 26.

FIG. 28 is a cross-sectional schematic diagram for explaining a process for producing the FLASH EPROM which is an example of the process for producing a semiconductor device according to the present invention, and showing a step after the step shown in FIG. 27.

DESCRIPTION OF THE PREFERRED EMBODIMENTS

-Resist Pattern Thickening Material-

Figure 1:
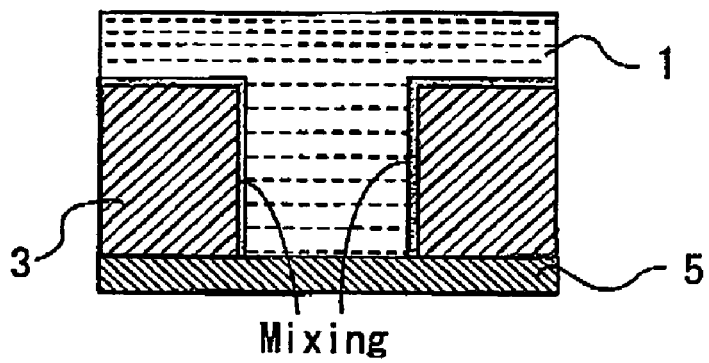
FIG. 1 is a schematic diagram for explaining one example of the mechanism of thickening a resist pattern to be thickened by using a resist pattern thickening material according to the present invention, and showing the state where the resist pattern thickening material is applied over the surface of the resist pattern to be thickened.

The resist pattern thickening material according to the present invention contains at least a resin and, in addition, may contain a basic substance, crosslinking agent, surfactant, water-soluble cyclic compound, organic solvent, phase transfer catalyst, polyhydric alcohol having at least two hydroxyl groups, depending on the requirements, and also it may contain additional components.

The resist pattern thickening material according to the present invention preferably exhibits a pH value of above 7 and not over 14 ($7<pH\leq14$) before coating on a resist pattern, more preferably is 8 or more and 11 or less ($8\leq pH\leq11$). The resist pattern thickening material according to the present invention exhibits a pH value of above 7 and not over 14 ($7<pH\leq14$) at coating on the resist pattern or after the coating, preferably is 8 or more and 11 or less ($8\leq pH\leq11$).

When the pH value of the resist pattern thickening material is 7 or less, the resist pattern thickening material is likely to lack storage stability, and also the thickening level of resist patterns may change depending on the environmental conditions such as temperature and atmosphere. On the contrary, when the pH value is above 7 and not over 14, such problems may be suppressed, the resist pattern thickening material shows superior storage stability and can thicken resist patterns uniformly, constantly and precisely regardless of the various environmental conditions such as temperature and atmosphere, or long or short storage period.

The resist pattern thickening material according to the present invention preferably contains a basic substance. Preferably, the existence of basic substance may maintain the pH of the resist pattern thickening material in alkaline condition by neutralizing even when a free acid generates during the storage, and also may maintain the pH at coating on the resist pattern or after the coating in alkaline condition by neutralizing, thus the resist pattern thickening material and the resist pattern can interact each other by a reaction in which acid does not intervene, that is, the resist pattern thickening material and the resist pattern may be interacted under other than acid-based reaction that tends to provide unstable factors. As a result, the resist pattern can be thickened properly and uniformly regardless of various species or sizes of the resist pattern thickening material i.e. independently with these factors.

-Basic Substance-

The basic substance may be properly selected depending on the application. For example, the above described crosslinking agent, surfactant, water-soluble cyclic compound, organic solvent, phase transfer catalyst, and polyhydric alcohol having at least two hydroxyl groups may also be the basic substance; preferably, a proper basic substance other than these components is employed independently.

Existence of the basic substance in the resist pattern thickening material may afford advantages such as easy pH adjustment of the resist pattern thickening material and superior storage stability.

Preferably, the basic substance is at least one selected from the group consisting of amines, amides, imides, quaternary ammonium salts, and derivatives of the compounds. These compounds may afford the advantages such as easy pH adjustment of the resist pattern thickening material and superior storage stability in particular.

Examples of amine include chain-like amines, cyclic amines, aromatic amines, and alcohol amines such as hexylamine, heptylamine, octylamine, nonylamine, decylamine, aniline, 2-methylaniline, 3-methylaniline, 4-methylaniline, 4-nitroaniline, 1-naphthylamine, 2-naphthylamine, ethylenediamine, tetramethylenediamine, hexamethylenediamine, 4-4'-diamino-1,2-diphenylethane, 4-4'-diamino-3,3'-dimethyldiphenylethane, 4-4'-diamino-3,3'-diethyldiphenylethane, dibutylamine, dipentylamine, dihexylamine, diheptylamine, dioctylamine, dinonylamine, didecylamine, N-methylaniline, piperidine, diphenylamine, trimethylamine, triethylamine, tripropylamine, tributylamine, tripentylamine, trihexylamine, triheptylamine, trioctylamine, trinonylamine, tridecylamine, methylbutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, tris[2-(2-methoxyethoxy)ethyl]amine, N,N-dimethylaniline, imidazole, pyridine, 4-methylpyridine, 4-methylimidazole, bipyridine, 2,2'-dipyridylamine, di-2-pyridylketone, 1,2-di(2-pyridyl)ethane, 1,2-di(4-pyridyl)ethane, 1,3-di(4-pyridyl)propane, 1,2-di(2-pyridyl)ethylene, 1,2-di(4-pyridyl)ethylene, 1,2-bis(4-pyridyloxy)ethane, 4,4'-dipyridylsulfide, 4,4'-dipyridyldisulfide, 2,2'-dipicolylamine, 3,3'-dipicolylamine, N-methyl-2-pyrrolidone, benzylamine, diphenylamine, monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine, and triisopropanolamine.

Examples of the amide include pentano-4-lactam, ε-caprolactam, succinamide, phthalamide, and cyclohexane carboxamide. Examples of the imide include succinimide, phthalimide, and cyclohexane dicarboxylic acid imide.

Examples of the quaternary ammonium salt include tetramethyl ammonium hydroxide, tetraethyl ammonium hydroxide, tetraisopropyl ammonium hydroxide, tetrabutylammonium hydroxide, 2-hydroxyethyl trimethylammonium hydroxide, and trimethylphenyl ammonium hydroxide. These basic compounds may be used alone or in combination.

The content of the basic compounds in the resist pattern thickening materials is not particularly limited, and may be properly selected depending on species and/or amount of the resin, crosslinking agent, surfactant or the like; the content is preferably 0.001 to 50% by mass, more preferably is 0.1 to 10% by mass.

When the content of the basic compounds is less than 0.001% by mass, the effects due to the addition of the basic compound may not be significant, thus pH at or after coating of the resist pattern thickening material on the resist pattern may be outside of above 7 and not over 14; on the other hand, the content of above 50% by mass may not provide a satisfactory effect from such higher amount of basic compound.

Preferably, resist pattern thickening material is water-soluble or alkaline-water soluble, since such solubility may bring about easy development and the like.

The solubility in water may be properly selected depending on the application, a preferable example is that 0.1 gram or more of resist pattern thickening material is soluble into 100 grams of water at 25° C.

Also, the solubility in alkaline-water may be properly selected depending on the application, a preferable example is that 0.1 gram or more of resist pattern thickening material is soluble into 100 grams of 2.38% by mass tetramethyl ammonium hydroxide (TMAH) aqueous solution.

The resist pattern thickening material is allowable even in a state of colloid or emulsion, preferably is water-soluble.

-Resin-

The resin is not particularly limited and may be properly selected depending on the application. The resin is preferably water-soluble or alkali-soluble, and more preferably is able to undergo a crosslinking reaction or able to mix with a water-soluble crosslinking agent.

Each molecule of the resin preferably comprises two or more polar groups in view of exhibiting an excellent water-solubility or alkali-solubility.

The polar group is not particularly limited and may be properly selected depending on the application. Examples thereof include hydroxyl group, amino group, sulfonyl group, carbonyl group, carboxyl group, derivatives thereof, and the like. The polar group may be contained singly or two or more polar groups may be contained in combination.

When the resin is water-soluble, the water-soluble resin preferably exhibits water solubility of 0.1 g or more in 100 g of water at 25° C., and more preferably exhibits water solubility of 0.3 g or more in 100 g of water at 25° C., and particularly preferably exhibits water solubility of 0.5 g or more in 100 g of water at 25° C.

Examples of the water-soluble resin include polyvinyl alcohol, polyvinyl acetal, polyvinyl acetate, polyacrylic acid, polyvinyl pyrolidone, polyethyleneimine, polyethylene oxide, styrene-maleic acid copolymer, polyvinylamine, polyallylamine, oxazoline group-containing water-soluble resins, water-soluble melamine resins, water-soluble urea resins, alkyd resins, sulfonamide resins, and the like.

When the resin is alkaline-water soluble, the alkaline-water soluble resin preferably exhibits alkaline-water solubility of 0.1 g or more in 100 g of 2.38% by mass tetramethyl ammonium hydroxide (TMAH) aqueous solution at 25° C., and more preferably exhibits alkaline-water solubility of 0.3 g or more in 100 g of 2.38% by mass TMAH aqueous solution at 25° C., and particularly preferably exhibits alkaline-water solubility of 0.5 g or more in 100 g of 2.38% by mass TMAH aqueous solution at 25° C.

Examples of the alkali-water soluble resin include novolak resins, vinylphenol resins, polyacrylic acids, polymethacrylic acids, poly p-hydroxyphenylacrylate, poly p-hydroxyphenylmethacrylate, copolymer thereof, and the like.

A resin may be used singly or in combination. Among these, polyvinyl alcohol, polyvinyl acetal, polyvinyl acetate and the like are preferable. The resin more preferably contains polyvinyl acetal at 5% by mass to 40% by mass.

Preferably, the resin contains a cyclic structure at least at a portion thereof. Such a cyclic structure may afford an advantage that excellent etching-resistance properties can be imparted to the resist pattern thickening material.

In the present invention, the resin having a cyclic structure at least at a portion thereof may be used singly or in combination.

The resin having a cyclic structure at a portion thereof is not particularly limited and may be properly selected depending on the application, those capable of causing a crosslinking reaction are preferable. Suitable examples thereof include polyvinyl arylacetal resins, polyvinyl arylether resins, polyvinyl arylester resins, and derivatives thereof, preferably, at least one is selected therefrom. From the standpoint of exhibiting water solubility or alkaline-water solubility to an appropriate degree, such a resin that contains an acetyl group is more preferable.

The polyvinyl arylacetal resins are not particularly limited and may be properly selected depending on the application. Examples thereof include β-resorcine acetal and the like.

The polyvinyl aryl ether resins are not particularly limited and may be properly selected depending on the application. Examples thereof include 4-hydroxybenzyl ether and the like.

The polyvinyl aryl ester resins are not particularly limited and may be properly selected depending on the application. Examples thereof include benzoate and the like.

The method for producing the polyvinyl arylacetal resins is not particularly limited and may be properly selected depending on the application. Suitable examples are conventional methods by making use of a polyvinyl acetal reaction, or the like. For example, polyvinyl alcohol, and aldehyde in an amount needed stoichiometrically for the polyvinyl alcohol undergo an acetalizing reaction in the presence of an acid catalyst. Specific examples are disclosed in U.S. Pat. Nos. 5,169,897 and 5,262,270, Japanese Patent Application Laid-Open (JP-A) No. 5-78414, and the like.

The method of producing the polyvinyl aryl ether resins is not particularly limited and may be properly selected depending on the application. Examples thereof are a copolymerization reaction of a corresponding vinyl aryl ether monomer and vinyl acetate; an etherizing reaction of polyvinyl alcohol and an aromatic compound having a halogenated alkyl group in the presence of a basic catalyst (the ether synthesizing reaction by Williamson); and the like. Specific examples are disclosed in JP-A Nos. 2001-40086, 2001-181383, 6-116194, and the like.

The method of producing the polyvinyl aryl ester resins is not particularly limited and may be properly selected depending on the application. Examples thereof are a copolymerization reaction of a corresponding vinyl arylester monomer and vinylacetate; an esterizing reaction of polyvinyl alcohol and an aromatic carboxylic acid halide compound in the presence of a basic catalyst; and the like.

The cyclic structure in the resin having a cyclic structure at a portion thereof, is not particularly limited and may be properly selected depending on the application. Examples thereof are monocyclic structure such as benzene, polycyclic structure such as bisphenol, condensed ring such as naphthalene, specifically, aromatic compounds, alicyclic compounds, heterocyclic compounds, and the like are preferred. In the resin having a cyclic structure at a portion thereof, a cyclic structure may be used singly or in combination.

Examples of the aromatic compound include polyhydroxy phenol compounds, polyphenol compounds, aromatic carboxylic acid compounds, naphthalene polyhydroxy compounds, benzophenone compounds, flavonoid compounds, porphin, water-soluble phenoxy resins, aromatic-containing water-soluble dyes, derivatives thereof, glycosides thereof, and the like. The aromatic compound may be used singly or in combination.

Examples of the polyhydric phenol compounds are resorcinol, resorcin[4]arene, pyrogallol, gallic acid, derivatives and glycosides thereof, and the like.

Examples of the polyphenol compounds include catechin, anthocyanidin (pelargonidin-type (4'-hydroxy), cyanidin-type (3',4'-dihydroxy), delphinidin-type (3',4',5'-trihydroxy)), flavan-3,4-diol, proanthocyanidin, and the like. Examples of the aromatic carboxylic acid compounds include salicylic acid, phthalic acid, dihydroxy benzoic acid, tannin, and the like.

Examples of the naphthalene polyhydroxy compounds include naphthalene diol, naphthalene triol, and the like. Examples of the benzophenone compounds include alizarin yellow A, and the like. Examples of the flavonoid compounds include flavone, isoflavone, flavanol, flavonone, flavonol, flavan-3-ol, aurone, chalcone, dihydrochalcone, quercetin, and the like.

Examples of the alicyclic compound include polycycloalkanes, cycloalkanes, fused rings, derivatives and glycosides thereof, and the like. These may be used singly or in combination.

Examples of the polycycloalkane include norbornane, adamantane, norpinane, sterane, and the like. Examples of the cycloalkane include cyclopentane, cyclohexane, and the like. Examples of the fused ring include steroids and the like.

Suitable examples of the heterocyclic compound include a nitrogen-containing cyclic compound such as pyrrolidine, pyridine, imidazole, oxazole, morpholine, pyrrolidone, and the like; and an oxygen-containing cyclic compound such as furan, pyran, saccharides such as pentose and hexose; and the like.

Preferable examples of the resin having a cyclic structure at a portion thereof are ones having at least one selected from the functional groups such as, for instance, hydroxyl group, cyano group, alkoxyl group, carboxyl group, amino group, amide group, alkoxycarbonyl group, hydroxyalkyl group, sulphonyl group, acid anhydride group, lactone group, cyanate group, and ketone group etc.; and the saccharic derivatives from the viewpoint of water-solubility. The one having at least one functional group selected from the hydroxyl group, amino group, sulphonyl group, carboxyl group, and their derivatives is more preferable.

The molar content ratio of the cyclic structure in the resin having a cyclic structure at a portion thereof, is not particularly limited as long as it does not affect the etching resistance, and may be properly selected depending on the application. In the case where high etching resistance is needed, it is preferably 5 mol % or more, and more preferably, 10 mol % or more.

The molar content ratio of a cyclic structure in the resin having a cyclic structure at a portion thereof, can be measured by means of NMR etc.

The content of the resins, including the resin having a cyclic structure at a portion thereof, in the resist pattern thickening material may be properly selected depending on the type and content of the basic substance or basic material and the like.

-Crosslinking Agent-

The crosslinking agents are not particularly limited and may be properly selected depending on the application. Preferable examples are ones that have water-solubility and cause crosslinking by heat or acid, and more preferable is an amino crosslinking agent.

Preferable examples of the amino crosslinking agent include melamine derivatives, urea derivatives, and uril derivatives and the like. These may be used alone or in combination.

Examples of the urea derivatives include urea, alkoxymethylene urea, N-alkoxymethylene urea, ethylene urea, ethylene urea carboxylic acid, their derivatives and the like. Examples of the melamine derivatives are alkoxymethyl melamine, their derivatives and the like. Examples of the uril derivatives are benzoguanamine, glycol uril, their derivatives and the like.

The content of the crosslinking agents in the resist pattern thickening material depends on the type and content etc. of the resin etc., so that it is impossible for it to be prescribed unconditionally. It may be properly selected depending on the application.

-Surfactant-

The surfactants are not particularly limited and may be suitably selected in accordance with the purpose. Examples thereof include nonionic surfactants, cationic surfactants, anionic surfactants, ampholytic surfactants and the like. These may be used singly or in combination. A suitable one among them is a nonionic surfactant from the point that it does not contain metallic ions.

Preferable examples of the nonionic surfactants are ones selected from alkoxylate surfactants, fatty acid ester surfactants, amide surfactants, alcoholic surfactants, and ethylenediamine surfactants. The concrete examples thereof include polyoxyethylene-polyoxypropylene condensation compounds, polyoxy alkylene alkylether compounds, polyoxy ethylene alkylether compounds, polyoxy ethylene derivative compounds, sorbitan fatty acid ester compounds, glycerine fatty acid ester compounds, primary alcohol ethoxylate compounds, phenol ethoxylate compounds, nonyl phenol ethoxylate compounds, octyl phenol ethoxylate compounds, lauryl alcohol ethoxylate compounds, oleyl alcohol ethoxylate compounds, fatty acid ester, amide, natural alcohol, ethylenediamine, secondary alcohol ethoxylate and the like.

The cationic surfactants are not particularly limited and may be properly selected depending on the application. Examples thereof include alkyl cationic surfactants, amide quaternary cationic surfactants, ester quaternary cationic surfactants and the like.

The ampholytic surfactants are not particularly limited and may be properly selected depending on the application. Examples thereof include amine oxide surfactants, betaine surfactants and the like.

The content of the surfactants in the resist pattern thickening material depends on the type and content etc. of the resin and basic substance or basic compound; the content may be properly selected depending on the application.

-Cyclic Structure-Containing Compound-

The cyclic structure-containing compound may be properly selected from those having a cyclic structure and an aqueous solubility depending on the application without particular limitations. The aqueous solubility is preferably 1 gram or more into 100 grams of water at 25° C., more preferably is 3 grams or more into 100 grams of water at 25° C., and most preferably is 5 grams or more into 100 grams of water at 25° C.

The cyclic structure-containing compound involved in the resist pattern thickening material may significantly and advantageously increase the etching resistance of the resulting pattern owing to the cyclic structure in the cyclic structure-containing compound.

Suitably examples of the cyclic structure-containing compound are aromatic compounds, alicyclic compounds, and heterocyclic compounds, preferably are aromatic compounds. These may be utilized alone or in combination.

Examples of the aromatic compound include polyhydroxy phenol compounds, polyphenol compounds, aromatic carboxylic acid compounds, naphthalene polyhydroxy compounds, benzophenone compounds, flavonoid compounds, porphins, water-soluble phenoxy resins, aromatic-containing water-soluble dyes, derivatives thereof, glycosides thereof, and the like. The aromatic compounds may be utilized alone or in combination.

Examples of the polyhydric phenol compounds include resorcinol, resorcin[4]arene, pyrogallol, gallic acid, derivatives and glycosides thereof, and the like.

Examples of the polyphenol compounds include catechin, anthocyanidin (pelargonidin-type (4'-hydroxy), cyanidin-type (3',4'-dihydroxy), delphinidin-type (3',4',5'-trihydroxy)), flavan-3,4-diol, proanthocyanidin, and the like.

Examples of the aromatic carboxylic acid compounds include salicylic acid, phthalic acid, dihydroxy benzoic acid, tannin, and the like. Examples of the naphthalene polyhydroxy compounds include naphthalene diol, naphthalene triol, and the like. Examples of the benzophenone compounds include alizarin yellow A, and the like. Examples of the flavonoid compounds include flavone, isoflavone, flavanol, flavonone, flavonol, flavan-3-ol, aurone, chalcone, dihydrochalcone, quercetin, and the like.

Examples of the alicyclic compound include polycycloalkanes, cycloalkanes, fused rings, derivatives and glycosides thereof, and the like. These may be used alone or in combination. Examples of the polycycloalkane include norbornane, adamantane, norpinane, sterane, and the like. Examples of the cycloalkane include cyclopentane, cyclohexane, and the like. Examples of the fused rings include steroids and the like.

Suitable examples of the heterocyclic compound include a nitrogen-containing cyclic compound such as pyrrolidine, pyridine, imidazole, oxazole, morpholine, pyrrolidone, and the like; and an oxygen-containing cyclic compound such as furan, pyran, saccharides such as pentose and hexose; and the like.

These cyclic structure-containing compounds may be used alone or in combination. Among these, the polyphenol compounds are preferable, in particular catechin and resorcine are preferable.

Among cyclic structure-containing compounds, from the viewpoint of water-solubility, the one having two or more polar groups is preferable, the one having three or more is more preferable, and the one having four or more is particularly preferable.

The polar group is not particularly limited and can be suitably selected in accordance with the purpose. Examples thereof are a hydroxyl group, a carboxyl group, a carbonyl group, a sulfonyl group, and the like.

The content of the cyclic structure-containing compound in the resist pattern thickening material may be selected depending on the type and content etc. of the resin, crosslinking agent, and surfactants etc.

-Organic Solvent-

The organic solvent is not particularly limited and may be properly selected depending on the application. Examples thereof include alcohol organic solvents, linear ester organic solvents, cyclic ester organic solvents, ketone organic solvents, linear ether organic solvents, cyclic ether organic solvents, and the like.

When the resist pattern thickening material contains the abovementioned organic solvent, the advantage is that the resin and the polyhydric alcohol having at least two of the hydroxyl groups and the crosslinking agent may be improved in terms of the solubility in the resist pattern thickening material.

Examples of the alcohol organic solvents include methanol, ethanol, propyl alcohol, isopropyl alcohol, butyl alcohol, and the like. Examples of the linear ester organic solvents include ethyl lactate, propylene glycol methyl ether acetate (PGMEA), and the like. Examples of the cyclic ester organic solvents include lactone organic solvents such as γ-butyrolactone, and the like. Examples of the ketone organic solvents include ketone organic solvents such as acetone, cyclohexanone, and heptanone, and the like.

Examples of the linear ether organic solvents include ethyleneglycol dimethylether, and the like. Examples of the cyclic ether organic solvents include tetrahydrofuran, dioxane, and the like.

These organic solvents may be used alone or in combination. Among these, solvents having a boiling point of about 80 to 200° C. are preferable from the viewpoint of performance to thicken the resist pattern precisely.

The content of the organic solvents in the resist pattern thickening material can be decided according to the type and content etc. of the resin, basic substance or basic compound, crosslinking agent, and surfactant etc.

-Phase Transfer Catalyst-

The phase transfer catalyst is not particularly limited and may be properly selected depending on the application. Examples thereof include organic materials, preferably are basic materials.

When the resist pattern thickening material contains the phase transfer catalyst, an advantage may be obtained that the resist pattern is efficiently and uniformly thickened regardless of a material of the resist pattern. Therefore, through utilizing such resist pattern thickening materials, the thickening effect of the resist pattern is hardly affected by materials of the resist pattern. Such effects of the phase transfer catalyst are not impaired, for instance, even if the resist pattern, which is the subject to be thickened with use of the resist pattern thickening material, contains an acid generating agent or not.

The preferable phase transfer catalyst is the one having water-solubility, and the water-solubility is such that 0.1 g or more can be dissolved in 100 g of water at temperature of 25° C.

Specific examples of the phase transfer catalyst include crown ether, azacrown ether, onium salt compounds, and the like.

The phase transfer catalyst may be used singly or in combination. Among these, onium salt compounds are preferable from the viewpoint of higher water-solubility.

Examples of the crown ether and azacrown ether include 18-crown-6, 15-crown-5, 1-aza-18-crown-6, 4,13-diaza-18-crown-6, 1,4,7-triazacyclononane, and the like.

The onium salt compounds are not particularly limited and may be properly selected depending on the application. The preferable examples thereof include quarternary ammonium salts, pyridinium salts, thiazolium salts, phosphonium salts, piperazinium salts, ephedrinium salts, quinium salts, cinchonium salts, and the like.

Examples of the quarternary ammonium salt include tetrabutylammonium hydrogensulfate, tetramethylammonium acetate, tetramethylammonium chloride, and the like which are often used for synthetic organic agents. Examples of the pyridinium salt include hexadecylpyridinium bromide, and the like. Examples of the thiazolium salt include 3-Benzyl-5-(2-hydroxyethyl)-4-methylthiazolium chloride, and the like. Examples of the phosphonium salt include tetrabutylphosphonium chloride, and the like. Examples of the piperazinium salt include 1,1-dimethyl-4-phenylpiperazinium, and the like. Examples of the ephedrinium salt include (−)-N,N-dimethylephedrinium bromide, and the like.

Examples of the quinium salt include N-benzylquininium chloride, and the like. Examples of the cinchonium salt include N-benzylcinchoninium chloride, and the like.

The content of the phase transfer catalyst in the resist pattern thickening material depends on the type and content etc. of the resin etc., so that it is impossible to define definitely, but it can be suitably selected according to the type and content etc. For instance, 10000 ppm or less is preferable, 10 to 10000 ppm is more preferable, 10 to 5000 ppm is further preferable, and 10 to 3000 ppm is particularly preferable.

When the content of the phase transfer catalyst is 10000 ppm or less, the advantageous point is that the resist pattern such as a line pattern etc. can be thickened independent of the size.

The content of the phase transfer catalyst can be measured with use of, for instance, liquid chromatography.

-Polyhydric Alcohol Having at Least Two Hydroxyl Groups-

The polyhydric alcohol having at least two hydroxyl groups is not particularly limited and may be properly selected depending on the application. Examples thereof include saccharides, derivatives of saccharides, glycosides, naphthalene polyhydric alcohol compound, and the like.

The saccharides may be properly selected depending on the application without particular limitations. Examples thereof include pentose, hexose, and the like. The concrete examples of the saccharides include arabinose, fructose, galactose, glucose, ribose, saccharose, maltose, and the like.

The derivatives of saccharides may be properly selected depending on the application without particular limitations. Preferable examples thereof are amino sugar, saccharic acid, deoxysuga, sugar alcohol, glycal, nucleoside, and the like.

The glycosides may be properly selected depending on the application without particular limitations. Preferable examples thereof include phenolic glycosides, and the like. Preferable examples of phenolic glycosides are salicin, arbutin, 4-aminophenyl galactopyranoside, and the like.

Examples of the naphthalene polyhydroxy compounds include naphthalene diol, naphthalene triol, and the like.

These may be used alone or in combination. Among these, the one having aromaticity is preferable from the viewpoint of being possible to add etching resistance to the resist pattern thickening material. Glycosides are preferable, and phenolic glycosides are more preferable.

The content of polyhydric alcohol having at least two hydroxyl groups in the resist pattern thickening material may be properly selected depending on the application without particular limitations. For instance, the preferable amount is 0.001 to 50 parts by mass base on the total amount of the resist pattern thickening material, and the more preferable amount is 0.1 to 10 parts by mass.

When the content of the polyhydric alcohol having at least two hydroxyl groups is less than 0.001 parts by mass, the amount of increased thickness of the resist pattern thickening material may depend on the resist pattern size. On the other hand, when it exceeds 10 parts by mass, a part of the resist pattern is possibly dissolved depending on the resist material.

-Other Components-

The other components are not particularly limited as long as they do not interfere with the effects of the present invention, and may be properly selected depending on the application. All types of known additives, for instance, thermal acid generating agents, quenchers such as amine type, amide type, ammonium chloride type quenchers etc. may be given as the examples.

-Application of Resist Pattern Thickening Material-

In the application of the resist pattern thickening materials according to the present invention, they are coated on resist patterns to be thickened.

The resist materials of resist patterns to be thickened may be properly selected from conventional resist materials including negative-type and positive-type without particular limitations. Examples of the resist materials include g-line resists, i-line resists, KrF resists, ArF resists, F2 resists, electron beam resists, and the like that can be patterned by means of g-line, i-line, KrF excimer laser, ArF excimer laser, F2 excimer laser, electron beam or the like, which may be or may not be chemically amplified type. Among these, KrF resists, ArF resists, and resists containing acrylic resins are preferable; in addition, ArF resists and resists containing acrylic resin are preferable from view point that they are demanded in terms of improvement in resolution limit for finer patterning and increase of throughput.

Preferably, the resist pattern exhibits a pH value of below 7 prior to thickening from the view point of consistent and stable thickening.

The specific examples of the resist pattern material include novolak resists, PHS resists, acrylic resists, cyclo olefin-maleic acid anhydrate (COMA) resists, cyclo olefin resists, hybrid resists such as alicyclic acrylic-COMA copolymer and the like. These resists may be modified by fluorine.

The method for coating the resist pattern thickening material is not particularly limited and can be selected from the known methods for coating. Examples thereof are roller coating method, dip coating method, spray coating method, bar coating method, kneader coating method, curtain coating method, and the like. Particularly, a spin coating method is preferable. In the case of the spin coating method, the condition is, for instance, a rotation speed of about 100 to 10000 rpm, and the preferable rotation speed is 80 to 5000 rpm. The preferable period is about 1 second to 10 minutes, and more preferably is 1 to 90 seconds.

The coating thickness at the time of the coating is usually about 10 to 1000 nm, and the preferable thickness is about 100 to 500 nm.

At the time of the coating, the surfactant may be coated separately before coating the resist pattern thickening material in stead of adding the surfactant into the resist pattern thickening material.

Pre-baking or warming-drying of the coated resist pattern thickening material during or before the coating is a preferable method because it efficiently generates mixing or infiltrating of the resist pattern thickening material into the resist pattern at the interface between the resist pattern and the resist pattern thickening material.

The condition and method for pre-baking or warming-drying are not particularly limited and can be suitably selected according to the purpose. For instance, the number of times of it may be once or two times or more. In the case of two times or more, the temperature of pre-baking may be constant or different respectively. When it is constant as mentioned above, the preferable temperature is about 60 to 150° C., and 70 to 120° C. is more preferable. The preferable period is about 30 to 300 seconds, and more preferably is 40 to 100 seconds.

The pre-baking is carried out by removing solvent, which may be carried out according to conditions recommended by the manufacturer, for example, independently with thickening the resist pattern.

Preferably, coating baking or mixing baking of the resist pattern thickening material is carried out after the pre-baking or warming-drying, because the mixing or infiltrating progresses efficiently at the interface between the resist pattern and the resist pattern thickening material.

The conditions for the coating baking or mixing baking may be properly selected depending on the application; typically the coating baking is carried out at a temperature higher than that of the pre-baking or warming-drying. The temperature at the coating baking is about 60 to 150° C., more preferable temperature is 90 to 130° C. The period is about 30 to 300 seconds, and the preferable period is 40 to 100 seconds.

When the temperature at coating baking or mixing baking is lower than 60° C., the coating baking or mixing baking may not progress efficiently, on the other hand, when the temperature is above 150° C., the shape of the resist pattern may be deformed by the higher temperature. The reaction without acid is a thermal reaction, thus the thickened or swelled level of the resist pattern tend to increase when the temperature rises.

Preferably, developing is carried out on the coated resist pattern thickening material after the coating baking or mixing baking is carried out. In this case, the portions of coated resist pattern thickening material where the interaction or mixing is not induced or is insufficient with the resist pattern can be successfully dissolved and removed to thereby develop the thickened resist pattern.

The development may be water development, development using weakly alkaline solution, or a combination thereof. Water development is preferable since the development can be carried out efficiently and at lower cost.

The development produces a thickened resist pattern, in which the resist pattern is thickened by the resist pattern thickening material. In the thickened resist pattern, the space pattern formed by the thickened resist pattern is finer and more precise than that of un-thickened resist pattern. Therefore, the thickened resist pattern can lead to finer and more precise electrical writings of semiconductor devices by applying it as a masking pattern at etching etc.

The resist pattern thickening material according to the present invention may be properly applied to a process for forming a resist pattern according to the present invention, and also be properly applied to a process for producing semiconductor device according to the present invention.

(Process for Forming Resist Pattern and Process for Producing Semiconductor Device)

The process for forming a resist pattern comprises coating the resist pattern thickening material according to the present invention on a resist pattern, thickening the resist pattern, and the others depending to the requirements.

The process for producing a semiconductor device according to the present invention comprises forming a thickened resist pattern, patterning, and the others depending to the requirements.

The semiconductor device according to the present invention is produced by the process for producing a semiconductor device according to the present invention.

The semiconductor device according to the present invention will be apparent through the explanations as to the process for producing a semiconductor device according to the present invention.

-Formation of Thickened Resist Pattern-

In forming the thickened resist pattern, a resist pattern is formed on a worked surface, the resist pattern thickening material according to the present invention is coated on the resist pattern by the process according to the present invention, thereby thickening the resist pattern to form a thickened resist pattern.

The formation of the thickened resist pattern, which corresponding to the process for forming a resist pattern according to the present invention, will be apparent through the explanations as to the formation of the thickened resist pattern.

-Workpiece-

The workpiece or substrate may be properly selected depending on the application, and may be a substrate of semiconductor device such as silicon wafer, interlayer insulating film, film of wiring material, various oxide films, or the like.

-Formation of Resist Pattern-

The process for forming the resist pattern may be properly selected depending on the application; for example, forming a coated layer of a conventional resist material by a conventional coating process, then irradiating the coated layer, thereby obtaining a resist pattern with an intended design. Further, baking may be optionally carried out after the irradiation.

The irradiating beam or light may be properly selected depending on the resist material; example thereof include g-line, i-line, KrF excimer laser, ArF excimer laser, F2 excimer laser beam, electron beams, and the like.

The size and thickness etc. of the resist pattern may be properly selected depending on the application; the thickness is 2 to 200 μm in general, and may be determined by the workpiece, etching conditions etc.

By the way, baking under vacuum condition (hereinafter, referring to as "vacuum baking") may be optionally carried out after the formation of the resist pattern in order to remove the residual acid in the resist pattern. The temperature at the vacuum baking may be properly selected depending on the application, for example, 60 to 150° C. is preferable, more preferably is 80 to 130° C.

When the temperature is below 60° C., the residual acid in the resist pattern may not be removed sufficiently, on the contrary, when the temperature is above 150° C., the shape of the resist pattern may be deformed by the higher temperature.

The vacuum level at the vacuum baking may be properly selected depending on the application, for example, preferably is 50 torr or less, more preferably is 10 torr or less.

When the vacuum level is above 50 torr, the effect to evaporate the residual acid in the resist pattern may not be significant and thus the residual acid may not be removed sufficiently.

The period of the vacuum baking may be properly selected depending on the application, for example, preferably is 10 to 300 seconds, more preferably is 30 to 120 seconds.

When the period is less than 10 seconds, the effect to evaporate the residual acid in the resist pattern may not be significant and thus the residual acid may not be removed sufficiently. When the period exceeds 300 seconds, the expected effect may not appear and the processing period may not be shortened.

The vacuum baking may be carried out by means of properly selected conventional apparatuses such as a vacuum heating apparatus.

The resist pattern thickening material may be that of the present invention. The coating process of the resist pattern thickening material may be that described above. Through the forming of the thickened resist pattern, the resist pattern is thickened to obtain a thickened resist pattern.

Preferably, the resulting thickened resist pattern represent properly high etching resistance. Preferably, the etching rate (nm/min) of the resist pattern is equivalent to or greater than that of the resist pattern to be thickened. Specifically, when measuring under the same condition, the ratio (resist pattern to be thickened/surface layer (mixing layer)) of the etching rate (nm/min) of the surface layer (mixing layer) to the etching rate (nm/min) of the resist pattern to be thickened is preferably 1.1 or more, and more preferably is 1.2 or more, and particularly preferably is 1.3 or more.

The etching rate (nm/min) can be measured by, for example, carrying out etching processing for a predetermined time by using a known etching device, measuring the amount of film reduction of the sample, and calculating the amount of film reduction per unit time.

The surface layer or mixing layer can suitably be formed by using the resist pattern thickening material according to the present invention. From the standpoint of improving the etching resistance, the surface layer or mixing layer preferably contains the cyclic structure, e.g., a resin having a cyclic structure at least on a portion thereof.

Whether or nor the surface layer contain the cyclic structure can be confirmed by, for example, analyzing the IR absorption spectrum of the surface layer.

Coating the resist pattern thickening material on the resist pattern, and allowing to interact or to mix with the resist pattern, then a mixing layer appears at the surface of the resist pattern that is formed by the interaction between the resist pattern thickening material and the resist pattern. Consequently, the resist pattern is thickened corresponding to the formation of the mixing layer, thus the thickened resist pattern is formed.

At this stage, the resist pattern thickening material according to the present invention exhibits a pH value of above 7 and not over 14 ($7<pH \leq 14$) at coating on the resist pattern or after the coating on the resist pattern. Accordingly, the resist pattern thickening material and the resist pattern may be interacted by aforesaid non-acid reaction without the acid-based reaction that provides unstable factors. Consequently, uniform thickening effect may be derived without being affected by species or sizes of the resist pattern. The resist pattern, which is formed in this way, represents space patterns of which the diameter or width is smaller than the space patterns of resist pattern prior to thickening. As a result, the space pattern formed by the resist pattern exceeds an exposure limit or resolution limit and can represent finer structures, in other words, the size of spaces such as pore and groove of the resulting space pattern is smaller than the lower limit of space that can be patterned by the wavelength of available irradiation sources.

Accordingly, when patterning a resist pattern by means of ArF excimer laser beam, and thickening the resist pattern by means of the resist pattern thickening material, the space pattern of resist formed by the thickened resist pattern can represent such fine and precise conditions as those patterned by electron beam.

The process for forming a resist pattern according to the present invention will be explained will be explained with reference to the attached figures.

Figure 2:
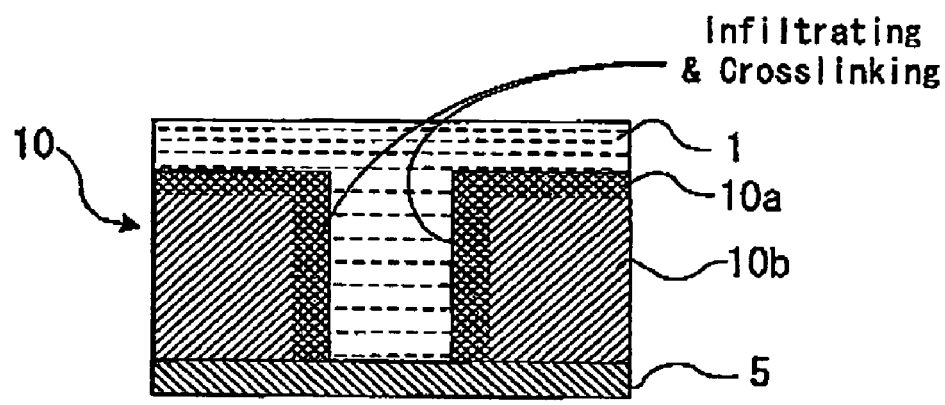
FIG. 2 is a schematic diagram for explaining one example of the mechanism of thickening a resist pattern to be thickened by using a resist pattern thickening material according to the present invention, and showing the state where the resist pattern thickening material infiltrates into the surface of the resist pattern to be thickened.
Figure 3:
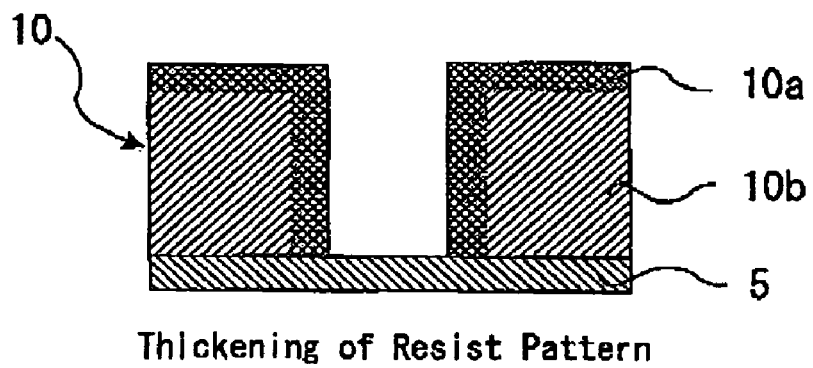
FIG. 3 is a schematic diagram for explaining one example of the mechanism of thickening a resist pattern to be thickened by using a resist pattern thickening material according to the present invention, and showing the state where the resist pattern is thickened by the resist pattern thickening material, thereby forming a resist pattern.
Figure 4:
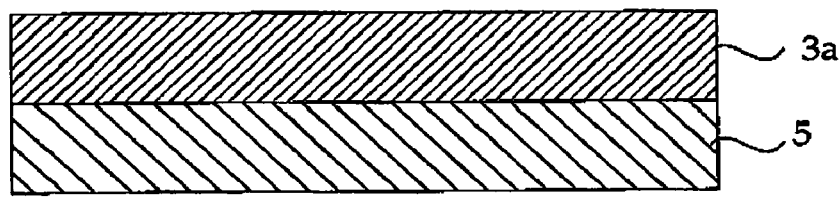
FIG. 4 is a schematic diagram for explaining an example of a process for forming a resist pattern according to the present invention, and showing the state where a resist layer is formed.
Figure 5:
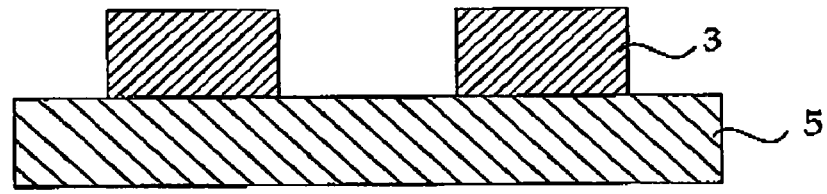
FIG. 5 is a schematic diagram for explaining an example of a process for forming a resist pattern according to the present invention, and showing the state where the resist layer is subjected to patterning, thereby forming a resist pattern to be thickened.
Figure 6:
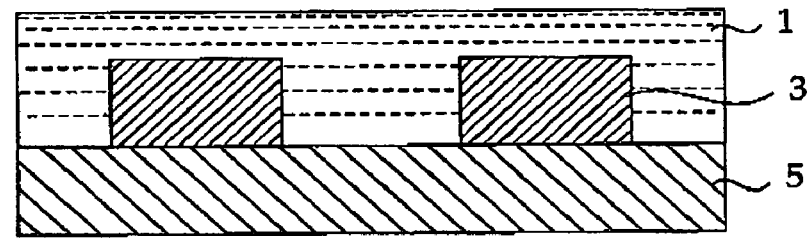
FIG. 6 is a schematic diagram for explaining an example of a process for forming a resist pattern according to the present invention, and showing the state where the resist pattern thickening material is applied over the surface of the resist pattern to be thickened.
Figure 7:
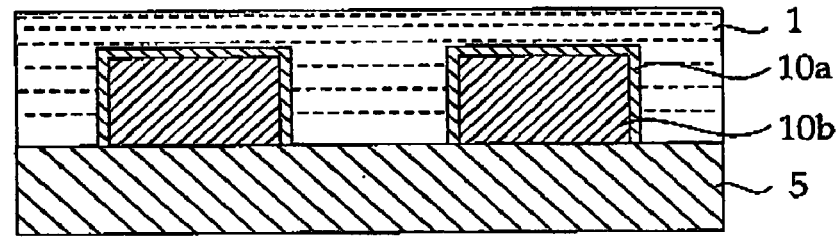
FIG. 7 is a schematic diagram for explaining an example of a process for forming a resist pattern according to the present invention, and showing the state where a mixing is occurred at the vicinity of the surface of the resist pattern to be thickened and the resist pattern thickening material infiltrates into the resist pattern to be thickened.
Figure 8:
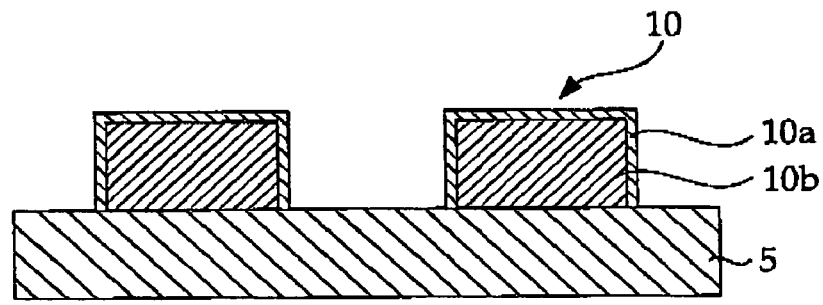
FIG. 8 is a schematic diagram for explaining an example of a process for forming a resist pattern according to the present invention, and showing the state where the resist pattern thickening material is developed.

As shown in FIG. 1, resist pattern 3 is formed on the surface of workpiece or substrate 5, then resist pattern thickening material 1 is applied or coated on the surface of resist pattern 3, and pre-baking such as warming and drying is conducted optionally. Then, mixing or infiltrating of resist pattern thickening material 1 into resist pattern 3 occurs at the interface between resist pattern 3 and resist pattern thickening material 1, thus surface layer or mixing layer 10a is formed by mixing or infiltrating at the interface between inner layer resist pattern 10b or resist pattern 3 and resist pattern thickening material 1 as shown in FIG. 2.

Even if residual acid exist in resist pattern 3 at this stage, resist pattern thickening material 1 represents a pH value of above 7 and not over 14 or less at coating or after coating on resist pattern 3; therefore, the residual acid can be neutralized and resist pattern 3 and resist pattern thickening material 1 can be interacted or mixed in a condition without acid. That is, since resist pattern 3 and resist pattern thickening material 1 can be interacted or mixed by the non-acid reaction, thickening of resist pattern 3 can be performed stably and uniformly without being significantly affected by environmental changes such as temperature and humidity.

Then, thickened resist pattern 10 is formed or developed with uniform thickening, by dissolving and removing the portions with no or less interaction or mixing with resist pattern 3 in resist pattern thickening material 1 coated on resist pattern 3, through developing process to remove water-soluble portions. The developing may be of water or alkaline developing liquid.

Thickened resist pattern 10 possesses surface layer or mixing layer 10a formed by mixing of resist pattern thickening material 1 on inner layer resist pattern 10b or resist pattern 3. The thickened resist pattern 10 is swelled by the thickness of surface layer or mixing layer 10a compared to resist pattern 3; therefore, the sizes of space pattern, e.g. distance between adjacent thickened resist patterns 10 and aperture size of hole pattern formed in thickened resist pattern, are smaller than those of resist pattern prior to thickening.

Accordingly, the space pattern formed by the resist pattern can be finer than the exposure limit or resolution limit of the exposure device to form resist pattern. For example, when exposing by means of ArF excimer laser beam, the space pattern can be as fine as that by means of electron beam. Thus, the space pattern formed by thickened resist pattern 10 is finer and more precise than the space pattern formed by resist pattern 3b.

The surface layer or mixing layer 10a of thickened resist pattern 10 is formed by resist pattern thickening material 1. When resist pattern thickening material 1 contains a cyclic structure as described above, the resulting resist pattern thickening material 1 may exhibit superior etching resistance even if the material of resist pattern or inner resist pattern 10b is relatively poor in etching resistance.

The space pattern formed by thickened resist pattern may be line-space pattern, hole pattern such as for contact hole, and trench or groove pattern, and the like.

The thickened resist pattern may be utilized as mask patterns, reticle patterns, or the like, and may be applied for fabricating of functional parts such as, recording heads, LCDs (liquid crystal displays), PDPs (plasma display panels), SAW filters (surface acoustic wave filters), and the like; optical parts used in connecting optical wiring; fine parts such as microactuators and the like; semiconductor devices; and the like, in particular may be employed in the pattering process described later.

-Patterning-

In the patterning, etching is carried out using the thickened resist pattern as a mask to pattern the workpiece surface.

The method of etching is not particularly limited, and can be appropriately selected from conventional methods depending on the application; dry etching is a suitable process. The etching conditions are not particularly limited and may be properly selected depending on the application.

Preferably, the residual resist pattern is peeled and removed in the patterning process depending on the requirements. The specific way to peel and remove may be properly selected depending on the application; a way using an organic solvent is exemplified.

Using the patterning process, various semiconductor devices such as flash memories, DRAM (Dynamic Random Access Memory), FRAM (Ferroelectric Random Access Memory), and the like may be produced efficiently.

The resulting semiconductor devices according to the present invention produced by the process for producing semiconductor devices according to the present invention possesses uniform and fine pattern such as wiring and displays high performance, thus may be utilized in various fields.

Hereinafter, the present invention will be described specifically by way of Examples, but it should be understood that the present invention is not limited thereto.

EXAMPLE 1

-Preparation of Resist Pattern Thickening Material-

Resist pattern thickening materials were prepared and evaluated as follows:

As shown in Table 1, 16 grams of polyvinyl acetal resin (KW-3, by Sekisui Chemical Co., Ltd.) as the resin; 0.29 gram of phenolethoxylate surfactant (non-ionic surfactant PC-6, by Asahi Denka Co., Ltd.) or 0.25 gram of primary alcohol ethoxylate surfactant (non-ionic surfactant TN-80, by Asahi Denka Co., Ltd.) as the surfactant; 1.35 grams or 1.16 grams of tetramethoxymethylglycol uril (Nikarrac, by Sanwa Chemical Co., Ltd.) as the crosslinking agent; a mixed solution of de-ionized water and isopropyl alcohol as the organic solvent (de-ionized water:isopropyl alcohol=98.6 g:0.4 g) or a mixed solution of de-ionized water and 2.38% by mass tetramethylammonium hydroxide as the organic solvent (de-ionized water:2.38% by mass tetramethylammonium hydroxide=90 g:3 g) were utilized and resist pattern thickening materials A to I were prepared as shown in Table 1.

The pH values of the resulting resist pattern thickening materials of A to I were measured and indicated in Table 1. The resist pattern thickening materials of A to H are examples of the present invention, and the resist pattern thickening material of I is a comparative example.

and I (comparative example) of stored at about 5° C. for one month, stored at 25° C. for one month, and immediately after their preparation.

Specifically, an element region was formed on a semiconductor substrate by a conventional process, then a layer of silicon oxide as an interlayer insulating film was coated entirely on the element region by a CVD process. Then, a positive-type resist layer of alicyclic type ArF resist (positive-type resist AX5190, by Sumitomo Chemical Co.) was formed on the silicon oxide layer, followed by irradiating ArF excimer laser beam at an exposure of 50 mJ/cm$^2$ and developing, thereby to form a hole pattern in 250 nm thick.

Then, the resist pattern thickening materials of A (example), E (example), F (example), G (example), and I (comparative example) of stored at about 5° C. for one month, stored at 25° C. for one month, and immediately after their

TABLE 1

| thickening material | resin (g) | surfactant (g) | crosslinking agent (g) | basic substance (g) | solvent | pH |
|---|---|---|---|---|---|---|
| A | KW-3 (16) | PC-6 (0.25) | uril (1.35) | diethanol amine (0.58) | water/IPA (98.6:0.4) | 8.96 |
| B | KW-3 (16) | PC-6 (0.25) | uril (1.35) | diethanol amine (0.58) | water/IPA (98.6:0.4) | 9.71 |
| C | KW-3 (16) | PC-6 (0.25) | uril (1.16) | N-methyl-2-pyrrolidone (0.27) | water/IPA (98.6:0.4) | 8.15 |
| D | KW-3 (16) | PC-6 (0.25) | uril (1.16) | tripropyl amine (0.68) | water/IPA (98.6:0.4) | 8.60 |
| E | KW-3 (16) | TN-80 (0.25) | uril (1.16) | — | water/TMAaq (90:3) | 9.05 |
| F | KW-3 (16) | TN-80 (0.25) | uril (1.16) | — | water/TMAaq (70:30) | 12.20 |
| G | KW-3 (16) | TN-80 (0.25) | uril (1.16) | succinimido (0.70) | water/IPA (98.6:0.4) | 7.25 |
| H | KW-3 (16) | PC-6 (0.25) | uril (1.16) | cyclohexane carboxyamide (0.88) | water/IPA (98.6:0.4) | 7.80 |
| I | KW-3 (16) | PC-6 (0.25) | uril (1.35) | — | water/IPA (98.6:0.4) | 4.20 |

IPA: isopropyl alcohol
TMAaq: aqueous solution of 2.38% by mass tetramethylammonium hydroxide Resist pattern thickening materials of A (example), E (example), F (example), G (example), and I (comparative example) were stored at about 5° C. and at 25° C. independently for one month immediately after their preparation, and the pH values were measured. The results are shown in Table 2 together with those of immediately after their preparation.

TABLE 2

| thickening material | pH immediately after preparation | pH 5° C. for one month | pH 25° C. for one month |
|---|---|---|---|
| A | 8.96 | 8.99 | 8.99 |
| E | 9.05 | 9.05 | 9.04 |
| F | 12.20 | 12.23 | 12.20 |
| G | 7.25 | 7.20 | 7.20 |
| I | 4.20 | 3.95 | 3.73 |

The results of Table 2 show that pH values were approximately consistent between immediately after preparation, after one month at 5° C., and after one month at 25° C. as for the resist pattern thickening materials of A (example), E (example), F (example), and G (example), demonstrating their superior storage stability. On the contrary, the pH of the resist pattern thickening material of I (comparative example) changed into more acidic during the storage at 5° C. for one month as well as at 25° C. for one month, demonstrating inferior storage stability. The reason is estimated that the resist pattern thickening material of I released or yielded a free acid during the storage and the free acid lowered the pH.

In addition, the thickening levels on a resist pattern were examined with respect to the resist pattern thickening materials of A (example), E (example), F (example), G (example), preparation were individually coated on the hole pattern by a spin coating method, first under the condition of 1000 rpm/5 sec, and then under the condition of 3500 rpm/40 sec to form each layer of the resist pattern thickening materials in about 100 nm thick. Thereafter, each layer of the resist pattern thickening materials was subjected to baking of coated layer or baking for mixing at 100° C. for 60 seconds, followed by rinsing by de-ionized water for 60 seconds to develop the each layer and to remove the portions where interaction or mixing did not occur, consequently resist patterns thickened by the resist pattern thickening materials of A (example), E (example), F (example), G (example), and I (comparative example) were obtained. Table 3 shows the space sizes as for the respective resist pattern thickening materials.

TABLE 3

| thickening material | initial space size of resist (nm) | space size of resist swelled by thickening material immediately after preparation (nm) | space size of resist swelled by thickening material after 25° C. for one month (nm) |
|---|---|---|---|
| A | 110.2 | 81.6 | 80.5 |
| E | 110.2 | 91.3 | 92.3 |
| F | 110.2 | 88.6 | 87.1 |
| G | 110.2 | 90.2 | 91.0 |
| I | 110.2 | 68.0 | 60.3 |

The results of Table 3 show that space sizes were approximately consistent when the resists were swelled by the resist pattern thickening materials of A (example), E (example), F (example), and G (example) of immediately after preparation as well as after one month at 25° C. that respectively exhibited pH stability as described above, demonstrating their superior stability with time, storage stability, and process uniformity. On the contrary, when the resists were swelled by the resist pattern thickening material of I (comparative example), which showed acidic pH initially and the pH changed into more acidic during the storage at 5° C. for one month as well as at 25° C. for one month, the space sizes represented a change between immediately after the preparation and after one month, demonstrating significantly inferior properties in stability with time, storage stability, and process uniformity.

-Formation of Thickening Resist Pattern (1)-

--Formation of Resist Pattern--

An element region was formed on a semiconductor substrate by a conventional process, then a silicon oxide layer as an interlayer insulating film was formed over the entire element region by a CVD (chemical vapor deposition) process. Then, a positive-type resist layer of alicyclic type ArF resist (positive-type resist AX5190, by Sumitomo Chemical Co.) was formed on the silicon oxide layer, followed by irradiating ArF excimer laser beam at an exposure of 50 mJ/cm$^2$ and developing, thereby to form a hole pattern in 250 nm thick. The space sizes of the holes were shown in Table 4.

--Coating of Resist Pattern Thickening Material & Formation of Thickened Resist Pattern--

Then, the resist pattern thickening materials of A to I were individually coated on the hole pattern by a spin coating method, first under the condition of 1000 rpm/5 sec, and then under the condition of 3500 rpm/40 sec to form each layer of the resist pattern thickening materials in about 100 nm thick. Thereafter, each layer of the resist pattern thickening materials was subjected to baking of coated layer or baking for mixing at 100° C. for 60 seconds, followed by rinsing by de-ionized water for 60 seconds to develop the each layer and to remove the portions where interaction or mixing did not occur, consequently resist patterns thickened by the resist pattern thickening materials of A to I were obtained. Table 4 shows the space sizes due to the respective resist pattern thickening materials.

TABLE 4

| thickening material | initial space size of resist (nm) | space size of resist swelled by thickening material (nm) |
| --- | --- | --- |
| A | 110.2 | 81.6 |
| B | 110.2 | 82.0 |
| C | 110.2 | 80.3 |
| D | 110.2 | 79.0 |
| E | 110.2 | 91.3 |
| F | 110.2 | 88.6 |
| G | 110.2 | 90.2 |
| H | 110.2 | 91.0 |
| I | 110.2 | 68.0 |

The results of Table 4 show that the resist pattern thickening materials of A to H could thicken respectively the resist pattern and the thickening level of the resist pattern thickening material I (comparative example) was somewhat higher than those of A to H (examples).

-Formation of Thickening Resist Pattern (2)-

--Formation of Resist Pattern--

An element region was formed on a semiconductor substrate by a conventional process, then a silicon oxide layer as an interlayer insulating film was formed over the entire element region by a CVD process. Then, a positive-type resist layer of alicyclic type ArF resist (positive-type resist AX5190, by Sumitomo Chemical Co.) was formed on the silicon oxide layer, followed by irradiating ArF (argon fluoride) excimer laser beam at an exposure of 50 mJ/cm$^2$ and developing, thereby to form a trench or groove pattern in 250 nm thick. The widths of the trench or groove were indicated in Table 5.

--Coating of Resist Pattern Thickening Material & Formation of Thickened Resist Pattern--

Then, the resist pattern thickening materials of A, B, C, D, and I were individually coated on the hole pattern by a spin coating method, first under the condition of 1000 rpm/5 sec, and then under the condition of 3500 rpm/40 sec to form each layer of the resist pattern thickening materials in about 100 nm thick. Thereafter, each layer of the resist pattern thickening materials was subjected to baking of coated layer or baking for mixing at 100° C. for 60 seconds, followed by rinsing by de-ionized water for 60 seconds to develop the each layer and to remove the portions where interaction or mixing did not occur, consequently resist patterns thickened by the resist pattern thickening materials of A to D, and I were obtained.

Table 5 shows the space sizes as for the respective resist pattern thickening materials of A to D, and I.

TABLE 5

| thickening material | initial space size of resist (nm) | space size of resist swelled by thickening material (nm) |
| --- | --- | --- |
| A | 201.0 | 161.0 |
| B | 201.0 | 161.2 |
| C | 201.0 | 160.5 |
| D | 201.0 | 164.5 |
| I | 201.0 | 173.0 |

The results of Table 5 show that the resist pattern thickening materials of A to D could thicken respectively the resist pattern and the thickening level of the resist pattern thickening material of I (comparative example) was somewhat higher than those of A to D (examples).

-Formation of Thickening Resist Pattern (3)-

--Formation of Resist Pattern--

An element region was formed on a semiconductor substrate by a conventional process, then a silicon oxide layer as an interlayer insulating film was formed over the entire element region by a CVD process. Then, a positive-type resist layer of alicyclic type ArF resist (positive-type resist AX5190, by Sumitomo Chemical Co.) was formed on the silicon oxide layer, followed by irradiating ArF excimer laser beam at an exposure of 50 mJ/cm$^2$ and developing, thereby to form plural types of trench or groove patterns of which lengths and widths are shown in Table 6. The thickness of the resist layer was 250 nm.

--Coating of Resist Pattern Thickening Material & Formation of Thickened Resist Pattern--

Then, the resist pattern thickening materials of A, E, and I were individually coated on the plural types of trench or groove patterns by a spin coating method, first under the condition of 1000 rpm/5 sec, and then under the condition of 3500 rpm/40 sec to form each layer of the resist pattern thickening materials in about 100 nm thick. Thereafter, each layer of the resist pattern thickening materials was subjected to baking of coated layer or baking for mixing at 100° C. for 60 seconds, followed by rinsing by de-ionized water for 60 seconds to develop the each layer and to remove the portions where interaction or mixing did not occur, consequently resist patterns thickened by the resist pattern thickening materials of A, E, and I were obtained.

Table 6 shows the space sizes of the plural trench patterns as for the respective resist pattern thickening materials of A, E, and I.

TABLE 6

| initial space size of resist length (nm)/ width (nm) | space size of resist swelled by thickening material A length (nm)/ width (nm) | space size of resist swelled by thickening material E length (nm)/ width (nm) | space size of resist swelled by thickening material I length (nm)/ width (nm) |
|---|---|---|---|
| 1205/101 | 18.5/17.0 | 30.5/28.0 | 60.4/18.0 |
| 1204/198 | 20.4/19.1 | 34.5/32.0 | 91.3/35.2 |
| 1198/305 | 23.1/21.0 | 33.0/31.0 | 116.5/58.0 |

The results in Table 6 show that the resist pattern thickening materials of A (example) and E (example) that exhibit alkaline represented substantially same space sizes in both directions of length and width, i.e. within 5 nm, even though the sizes of trench or groove of the resists were different, thus presenting substantially stable and uniform space sizes without depending the sizes of pattern. On the contrary, the resist pattern thickening material of I (comparative example) the space sizes were considerably longer in the length direction than the width direction, and the apace sizes changed depending on the size of trench or groove of the resists.

EXAMPLE 2

Figure 9:
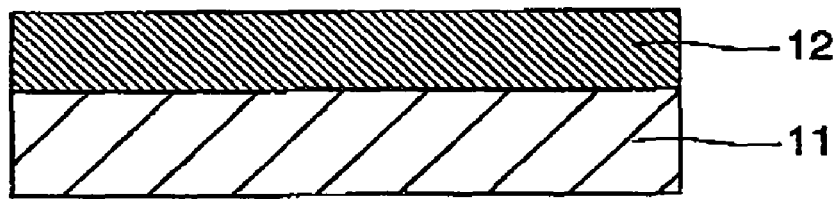
FIG. 9 is a schematic diagram for explaining an example of a process for producing a semiconductor device according to the present invention, and showing the state where an interlayer insulating film is formed on a silicon substrate.
Figure 10:
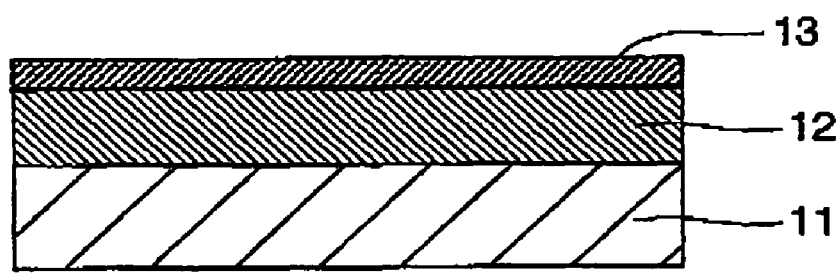
FIG. 10 is a schematic diagram for explaining an example of a process for producing a semiconductor device according to the present invention, and showing the state where a titanium film is formed on the interlayer insulating film.
Figure 11:
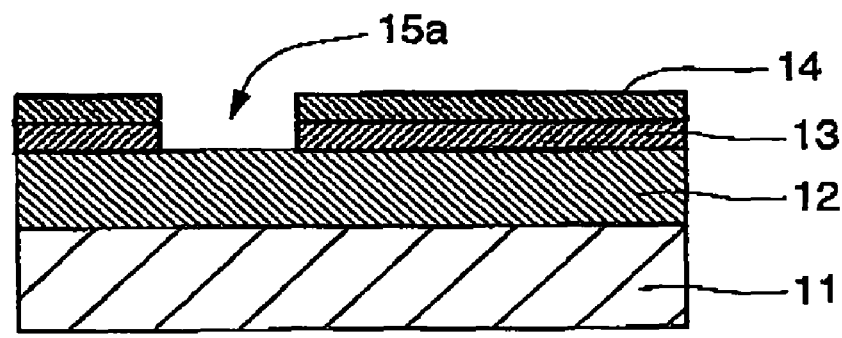
FIG. 11 is a schematic diagram for explaining an example of a process for producing a semiconductor device according to the present invention, and showing the state where a resist film is formed on the titanium film and a hole pattern is formed on the titanium film.
Figure 12:
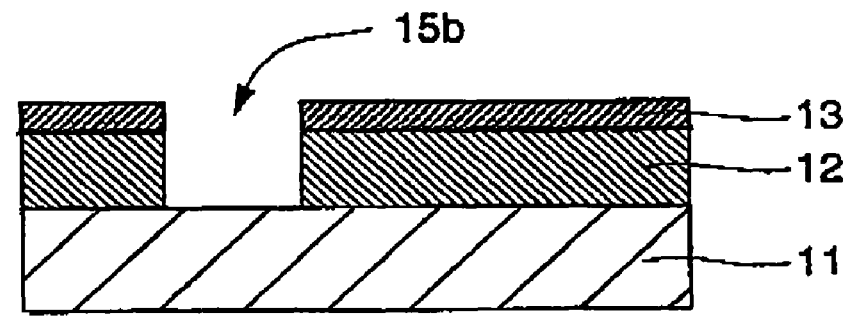
FIG. 12 is a schematic diagram for explaining an example of a process for producing a semiconductor device according to the present invention, and showing the state where the hole pattern is also formed on the titanium film.

As shown in FIG. 9, interlayer insulating film 12 was formed on silicon substrate 11. As shown in FIG. 10, titanium film 13 was formed by a sputtering method on the interlayer insulating film 12. Then, as shown in FIG. 11, resist pattern 14 was formed. By using resist pattern 14 as a mask, the titanium film 13 was patterned by reactive ion etching such that openings 15a were formed. Subsequently, as shown in FIG. 12, resist pattern 14 was removed by reactive ion etching, and openings 15b were formed in the interlayer insulating film 12 by using titanium film 13 as a mask.

Figure 13:
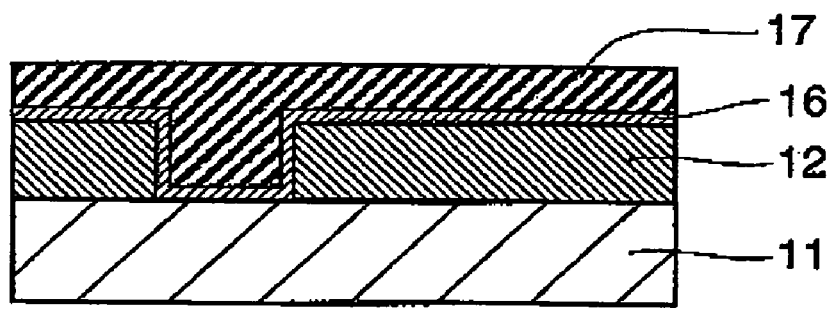
FIG. 13 is a schematic diagram for explaining an example of a process for producing a semiconductor device according to the present invention, and showing the state where a copper film is formed on the interlayer insulating film having the hole pattern.
Figure 14:
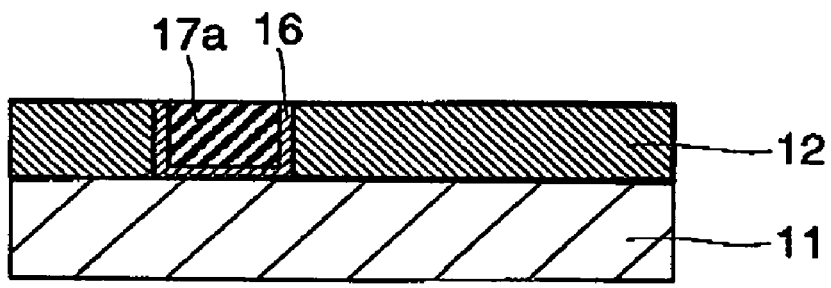
FIG. 14 is a schematic diagram for explaining an example of a process for producing a semiconductor device according to the present invention, and showing the state where the copper is removed from the layer on the hole pattern of the interlayer insulating film.

Then, titanium film 13 was removed by wet processing, and as shown in FIG. 13, TiN film 16 was formed on interlayer insulating film 12 by a sputtering method. Subsequently, Cu film 17 was grown by an electrolytic plating method on TiN film 16. Then, as shown in FIG. 14, planarizing was carried out by CMP such that the barrier metal and the Cu film or first metal film remained only in the groove portions corresponding to the openings 15b in FIG. 12, and wires 17a of a first layer were formed.

Figure 15:
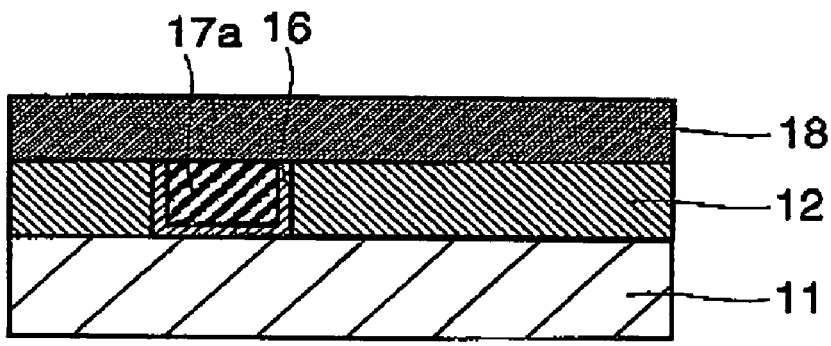
FIG. 15 is a schematic diagram for explaining an example of a process for producing a semiconductor device according to the present invention, and showing the state where an interlayer insulating film is formed on the copper plug formed inside of the hole pattern, and on the interlayer insulating film.
Figure 16:
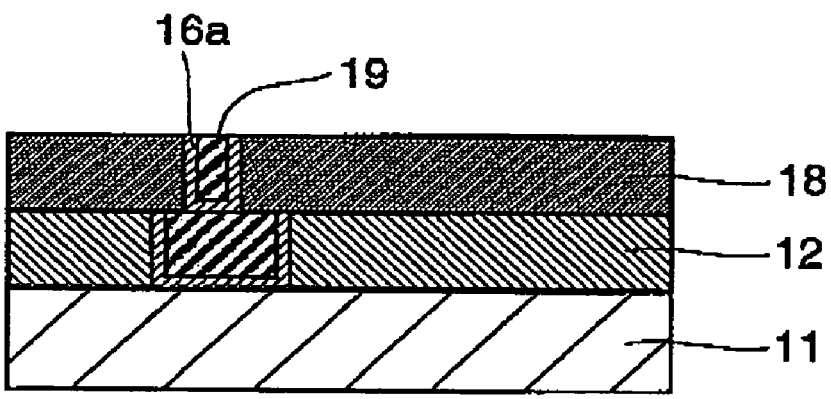
FIG. 16 is a schematic diagram for explaining an example of a process for producing a semiconductor device according to the present invention, and showing the state where a hole pattern is formed on the interlayer insulating film as a surface layer and a copper plug is formed therein.

Then, as shown in FIG. 15, interlayer insulating film 18 was formed on wires 17a of the first layer. Thereafter, in the same way as in FIGS. 9 to 14, Cu plugs or second metal films 19 and TiN films 16a, which connected the wires 17a of the first layer to upper layer wires which would be formed later, were formed as shown in FIG. 16.

Figure 17:
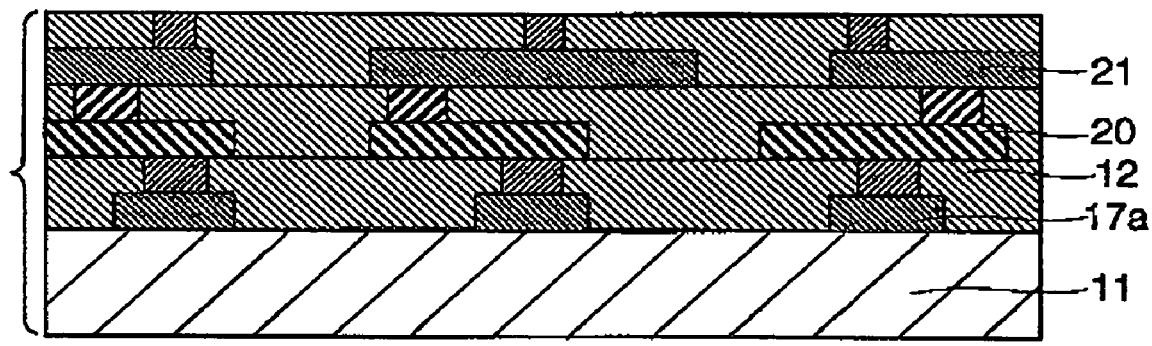
FIG. 17 is a schematic diagram for explaining an example of a process for producing a semiconductor device according to the present invention, and showing the state where a three-layered wiring is formed.

By repeating the above-described respective processes, as shown in FIG. 17, a semiconductor device was fabricated which had a multilayer wiring structure having, on the silicon substrate 11, the wires 17a of the first layer, wires 20 of a second layer, and wires 21 of a third layer. Note that the barrier metal layers formed beneath the wires of the respective layers are not shown in FIG. 17.

In this Example 2, resist pattern 14 is a resist pattern fabricated in the same way as in the case of Example 1, by using the resist pattern thickening material of the present invention.

EXAMPLE 3

-Flash Memory and Process for Producing Thereof-

Example 3 is an example of the semiconductor device and process for producing thereof according to the present invention using the resist pattern thickening material according to the present invention. Note that, in Example 3, resist films 26, 27, 29, and 32 which will be described hereinafter are resist films which have been thickened by the same process as in Examples 1 and 2 by using the resist pattern thickening material according to the present invention.

Figure 18:
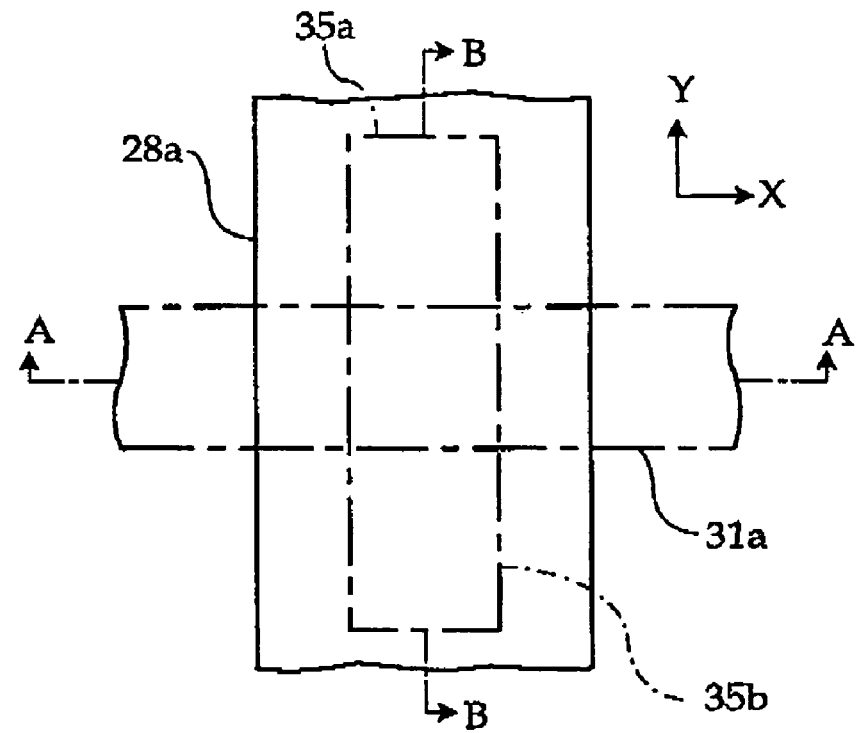
FIG. 18 is a top view for explaining a FLASH EPROM which is one example of a semiconductor device according to the present invention.
Figure 19:
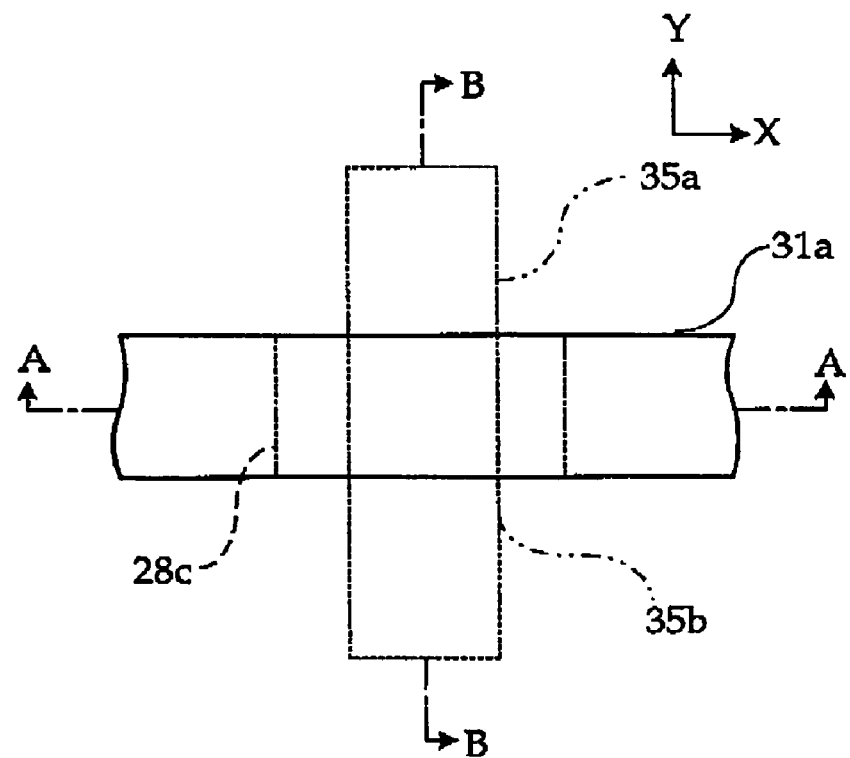
FIG. 19 is a top view for explaining a FLASH EPROM which is another example of a semiconductor device according to the present invention.

FIGS. 18 and 19 are top views or plan views of a FLASH EPROM (Erasable Programmable Read Only Memory) which is called a FLOTOX (Floating Gate Tunnel Oxide) type or an ETOX (Electrically Tunneling Oxide) type. Note that FIGS. 20 to 28 are cross-sectional schematic views for explaining an example of a process for producing the FLASH EPROM. In FIGS. 20 to 28, the illustrations at the left sides are a memory cell portion (a first element region), and are schematic diagrams of the cross-section (the A direction cross-section) of the gate widthwise direction (the X direction in FIGS. 18 and 19) of the portion at which a MOS (Metal Oxide Silicon) transistor having a floating gate electrode is formed. The illustrations at the center are the memory cell portion, which is the same portion as in the left side drawings, and are schematic diagrams of the cross-section (the B direction cross-section) of the gate lengthwise direction (the Y direction in FIGS. 18 and 19) which is orthogonal to the X direction. The illustrations at the right side are schematic diagrams of the cross-section (the A direction cross-section in FIGS. 18 and 19) of the portion of the peripheral circuit portion or a second element region at which a MOS transistor is formed.

Figures 20, 21, 22:
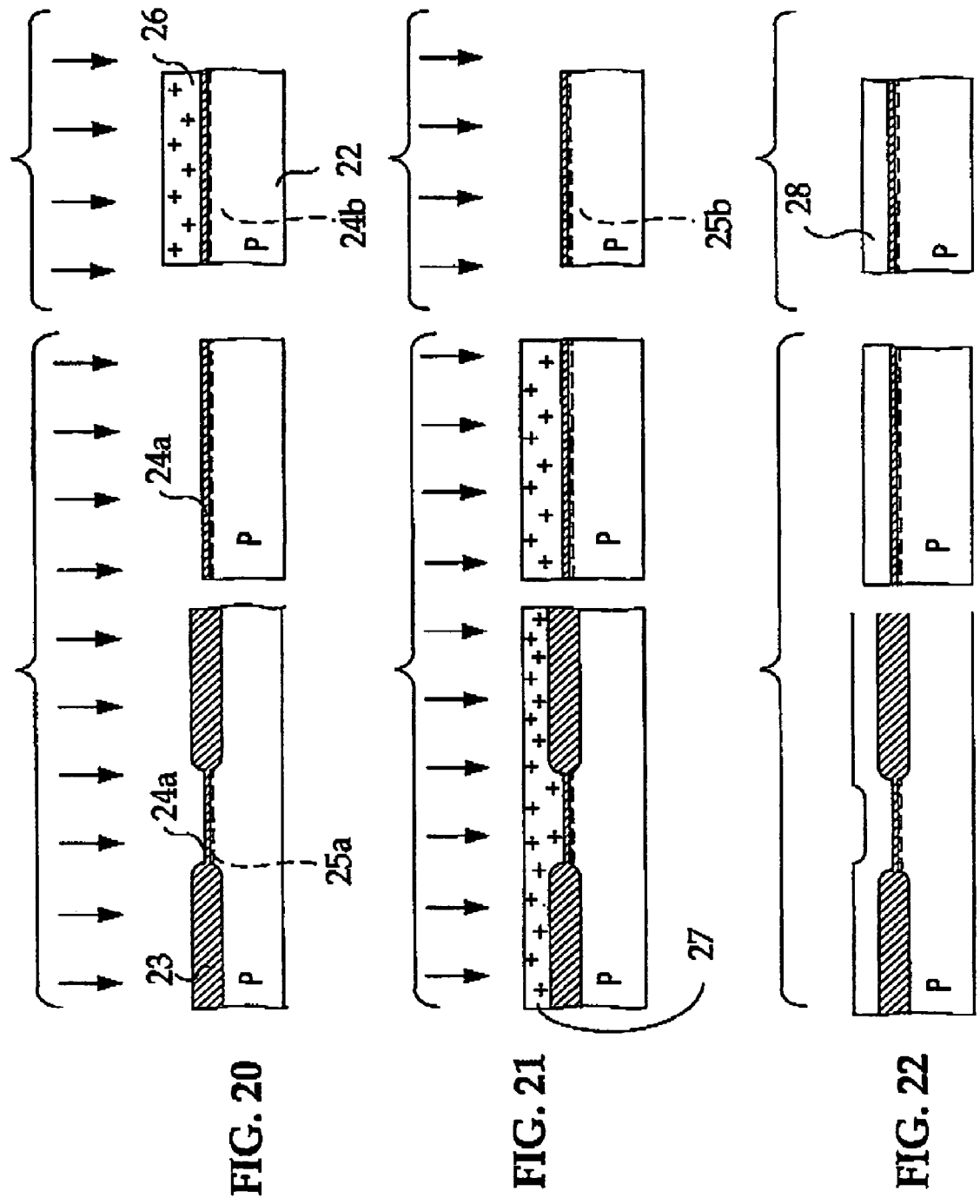
FIG. 20 is a cross-sectional schematic diagram for explaining a process for producing the FLASH EPROM which is an example of the process for producing a semiconductor device according to the present invention.
FIG. 21 is a cross-sectional schematic diagram for explaining a process for producing the FLASH EPROM which is an example of the process for producing a semiconductor device according to the present invention, and showing a step after the step shown in FIG. 20.
FIG. 22 is a cross-sectional schematic diagram for explaining a process for producing the FLASH EPROM which is an example of the process for producing a semiconductor device according to the present invention, and showing a step after the step shown in FIG. 21.

First, as shown in FIG. 20, field oxide film 23 of $SiO_2$ was selectively formed at the element isolation region on p-type Si substrate 22. Thereafter, first gate insulating film 24a was formed at the MOS transistor of the memory cell portion (the first element region), by an $SiO_2$ film by thermal oxidation so as to become a thickness of 10 nm to 30 nm. In a separate process, second gate insulating film 24b was formed at the MOS transistor of the peripheral circuit portion (the second element region), by an $SiO_2$ film by thermal oxidation so as to become a thickness of 10 nm to 50 nm. Note that, when the first gate insulating film 24a and the second gate insulating film 24b are the same thickness, these oxide films may be formed simultaneously in the same process.

Next, in order to form a MOS transistor having depression type n-channels at the memory cell portion (the left side and the center in FIG. 20), the peripheral circuit portion (the right side in FIG. 20) was masked by resist film 26 for the purpose of controlling the threshold voltage. Then, phosphorus (P) or arsenic (As) was introduced, as an n-type impurity in a dosage amount of $1 \times 10^{11}$ $cm^{-2}$ to $1 \times 10^{14}$ $cm^{-2}$ by an ion implantation method, into the regions that were to become the channel regions directly beneath the floating gate electrodes, such that a first threshold value control layer 25a was formed. Note that the dosage amount and the conductive type of the impurity at this time can be appropriately selected in accordance with whether depression type channels or accumulation type channels are to be formed.

Then, in order to form a MOS transistor having depression type n-channels at the peripheral circuit portion (the right side in FIG. 21), the memory cell portion (the left side and the center in FIG. 21) was masked by the resist film 27 for the purpose of controlling the threshold voltage. Then, phosphorus (P) or arsenic (As) was introduced, as an n-type impurity in a dosage amount of $1\times10^{11}$ cm$^{-2}$ to $1\times10^{14}$ cm$^{-2}$ by an ion implantation method, into the regions that were to become the channel regions directly beneath the gate electrodes, such that a second threshold value control layer 25b was formed.

Next, a first polysilicon film (a first conductor film) 28 having a thickness of 50 nm to 200 nm was applied over the entire surface as a floating gate electrode of the MOS transistor at the memory cell portion (the left side and the center in FIG. 22) and as a gate electrode of the MOS transistor at the peripheral circuit portion (the right side in FIG. 22).

Figure 23:
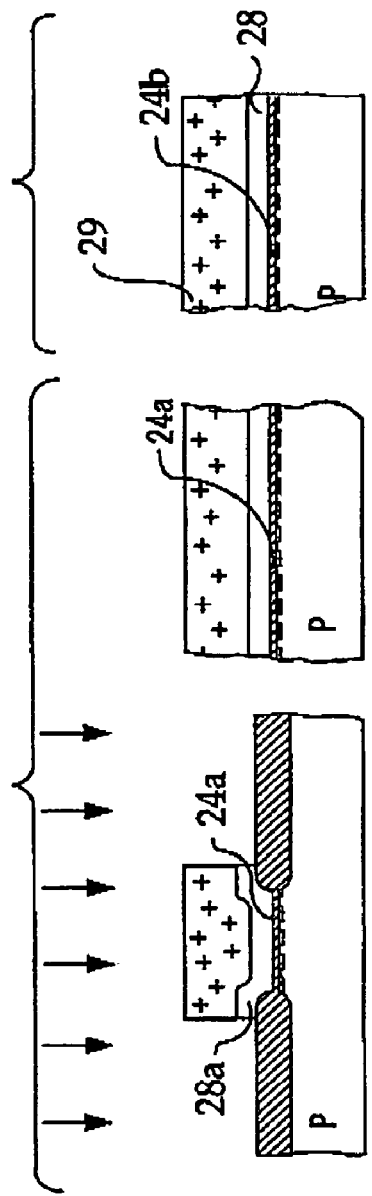
FIG. 23 is a cross-sectional schematic diagram for explaining a process for producing the FLASH EPROM which is an example of the process for producing a semiconductor device according to the present invention, and showing a step after the step shown in FIG. 22.

Thereafter, as shown in FIG. 23, the first polysilicon film 28 was patterned by using a resist film 29 formed as a mask, such that a floating gate electrode 28a was formed at the MOS transistor at the memory cell portion (the left side and the center in FIG. 23). At this time, as shown in FIG. 23, in the X direction, patterning was carried out so as to obtain the final width, and in the Y direction, the region which was to become the S/D region layer remained covered by the resist film 29 without patterning.

Figure 24:
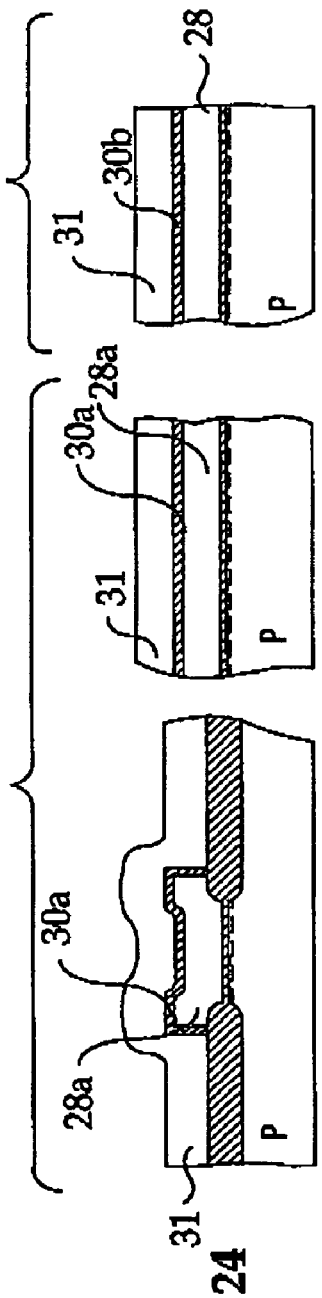
FIG. 24 is a cross-sectional schematic diagram for explaining a process for producing the FLASH EPROM which is an example of the process for producing a semiconductor device according to the present invention, and showing a step after the step shown in FIG. 23.

Next, as shown in the left side and the center of FIG. 24, after the resist film 29 was removed, a capacitor insulating film 30a formed of an SiO$_2$ film was formed by thermal oxidation to a thickness of approximately of 20 nm to 50 nm so as to cover the floating gate electrode 28a. At this time, a capacitor insulating film 30b formed of an SiO$_2$ film was formed on the first polysilicon film 28 of the peripheral circuit portion (the right side in FIG. 24). Here, although the capacitor insulating films 30a and 30b were formed only by SiO$_2$ films, they may be formed by a composite film of two to three layers of SiO$_2$ and Si$_3$N$_4$ films.

Then, as shown in FIG. 24, second polysilicon film or second conductor film 31, which was to become a control gate electrode, was formed to a thickness of 50 nm to 200 nm so as to cover the floating gate electrode 28a and the capacitor insulating film 30a.

Figure 25:
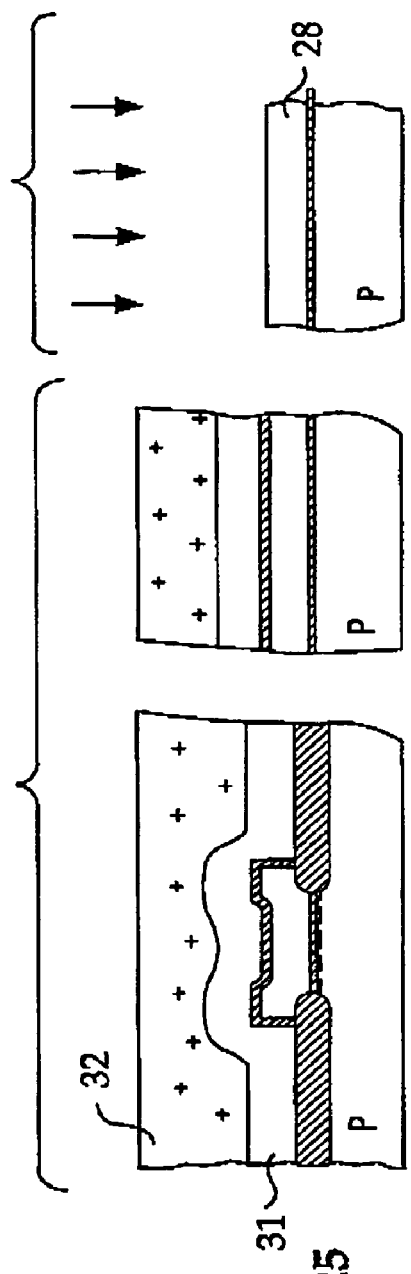
FIG. 25 is a cross-sectional schematic diagram for explaining a process for producing the FLASH EPROM which is an example of the process for producing a semiconductor device according to the present invention, and showing a step after the step shown in FIG. 24.

Then, as shown in FIG. 25, the memory portion (the left side and the center of FIG. 25) was masked by resist film 32, and the second polysilicon film 31 and the capacitor insulating film 30b of the peripheral circuit portion (the right side in FIG. 25) were successively removed by etching such that the first polysilicon film 28 was exposed at the surface.

Subsequently, as shown in FIG. 26, the second polysilicon film 31, the capacitor insulating film 30a and the first polysilicon film 28a which had been patterned only in the X direction, of the memory portion (the left side and the center of FIG. 26), were, by using the resist film 32 as a mask, subjected to patterning in the Y direction so as to become the final dimension of a first gate portion 33a. A laminate structure formed by control gate electrode 31a/capacitor insulating film 30c/floating gate electrode 28c, which had a width of approximately 1 µm in the Y direction, was formed. The first polysilicon film 28 of the peripheral circuit portion (the left side in FIG. 26) was, by using the resist film 32 as a mask, subjected to patterning so as to become the final dimension of second gate portion 33b, and gate electrode 28b of a width of approximately 1 µm was formed.

Next, by using the laminate structure formed by the control gate electrode 31a/the capacitor insulating film 30c/the floating gate electrode 28c of the memory cell portion (the left side and the center of FIG. 27) as a mask, phosphorus (P) or arsenic (As) was introduced, in a dosage amount of $1\times10^{14}$ cm$^{-2}$ to $1\times10^{16}$ cm$^{-2}$ by an ion implantation method, into the Si substrate 22 of the element forming region, such that n-type S/D region layers 35a and 35b were formed. By using the gate electrode 28b at the peripheral circuit portion (the right side of FIG. 27) as a mask, phosphorus (P) or arsenic (As) was introduced, as an n-type impurity in a dosage amount of $1\times10^{14}$ cm$^{-2}$ to $1\times10^{16}$ cm$^{-2}$ by an ion implantation method, into the Si substrate 22 of the element forming region, such that S/D region layers 36a and 36b were formed.

Subsequently, the first gate portion 33a of the memory cell portion (the left side and the center of FIG. 28) and the second gate portion 33b of the peripheral circuit portion (the right side of FIG. 28) were covered by forming interlayer insulating film 37 formed of a PSG film to a thickness of about 500 nm.

Thereafter, contact holes 38a, 38b and contact holes 39a, 39b were formed in the interlayer insulating film 37 formed on the S/D region layers 35a, 35b and the S/D region layers 36a, 36b. Thereafter, S/D electrodes 40a, 40b and S/D electrodes 41a, 41b were formed. In order to form the contact holes 38a, 38b, 39a and 39b, the hole pattern was formed with the resist material and then thickened the resist pattern with the resist pattern thickening material according to the present invention, thereby forming fine space patterns (hole patterns). Thereafter, the contact holes were fabricated in accordance with a conventional method.

In this way, as shown in FIG. 28, the FLASH EPROM was fabricated as a semiconductor device.

In this FLASH EPROM, the second gate insulating film 24b of the peripheral circuit portion (the right side in FIGS. 20 to 28) is covered by the first polysilicon film 28 or the gate electrode 28b (refer to the right side in FIGS. 20 to 28) always after formation. Thus, the second gate insulating film 24b is maintained at the thickness at which it was initially formed. Thus, it is easy to control the thickness of the second gate insulating film 24b, and easy to adjust the concentration of the conductive impurity in order to control the threshold voltage.

Note that, in the above-described example, in order to form the first gate portion 33a, first, patterning is carried out at a predetermined width in the gate widthwise direction (the X direction in FIGS. 18 and 19), and thereafter, patterning is carried out in the gate lengthwise direction (the Y direction in FIGS. 18 and 19) so as to attain the final predetermined width. However, conversely, patterning may be carried out at a predetermined width in the gate lengthwise direction (the Y direction in FIGS. 18 and 19), and thereafter, patterning may be carried out in the gate widthwise direction (the X direction in FIGS. 18 and 19) so as to attain the final predetermined width.

Figures 29, 30, 31:
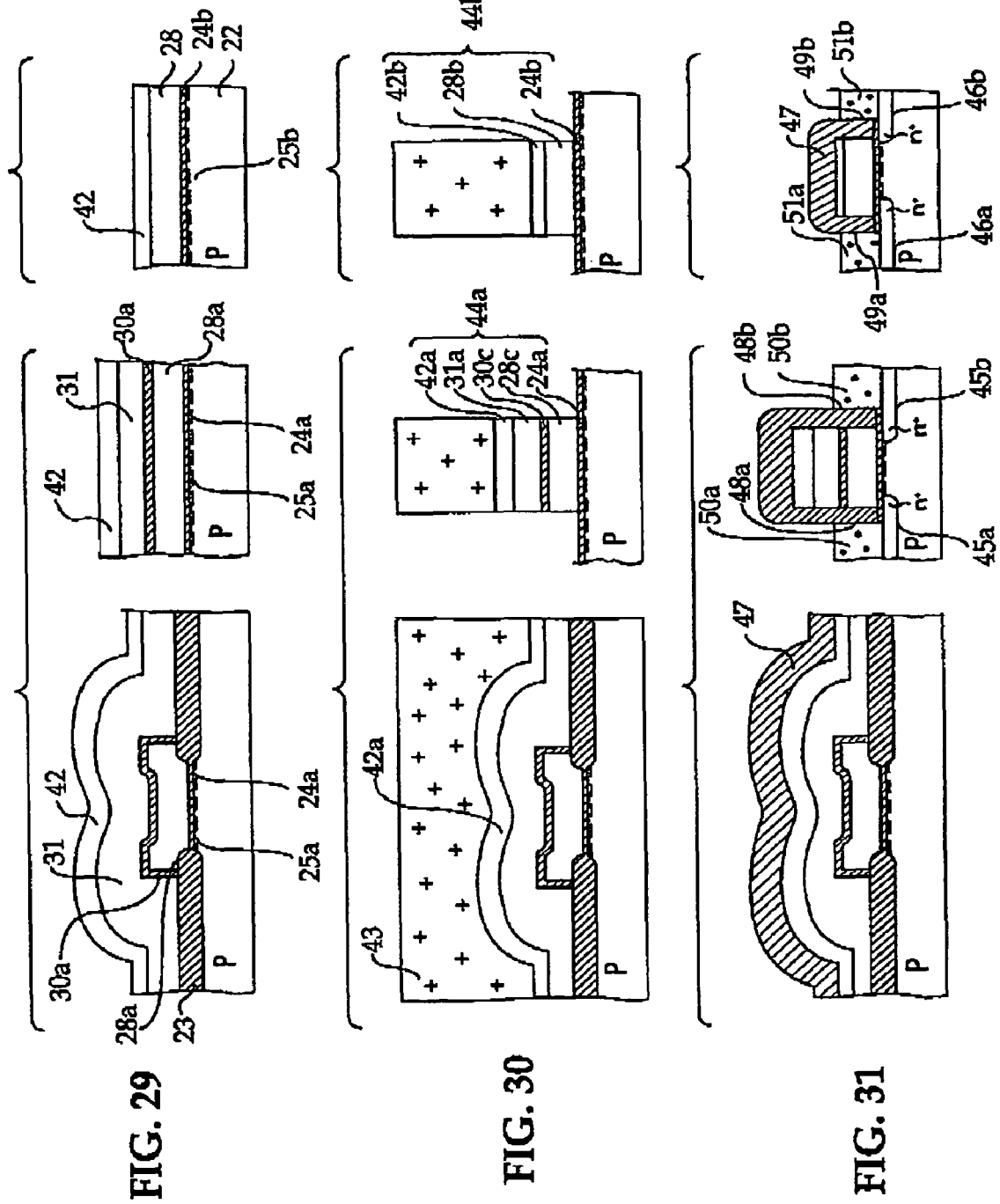
FIG. 29 is a cross-sectional schematic diagram for explaining the process for producing the FLASH EPROM which is another example of the process for producing a semiconductor device according to the present invention.
FIG. 30 is a cross-sectional schematic diagram for explaining the process for producing the FLASH EPROM which is another example of the process for producing a semiconductor device according to the present invention, and showing a step after the step shown in FIG. 29.
FIG. 31 is a cross-sectional schematic diagram for explaining the process for producing the FLASH EPROM which is another example of the process for producing a semiconductor device according to the present invention, and showing a step after the step shown in FIG. 30.

The example of fabricating a FLASH EPROM shown in FIGS. 29 to 31 is the same as the above-described example, except that the processes after the process shown by FIG. 28 in the above example are changed to the processes shown in FIGS. 29 to 31. Namely, as shown in FIG. 29, this example differs from the above-described example only with respect to the point that a polycide film is provided by forming a high melting point metal film (a fourth conductor film) 42 formed of a tungsten (W) film or a titanium (Ti) film to a thickness of approximately 200 nm, on the second polysilicon film 31 of the memory cell portion shown at the left side and the center of FIG. 29 and on the first polysilicon film 28 of the peripheral circuit portion shown at the right side in FIG. 29. The processes after FIG. 29, i.e., the processes shown in FIGS. 30 and 31, are the same as those shown in FIGS. 26 to 28. Explanation of the processes which are the same as those shown in FIGS. 26 to 28 is omitted. In FIGS. 29 to 31, portions which are the same as those in FIGS. 26 to 28 are denoted by the same reference numerals.

In this way, as shown in FIG. 31, the FLASH EPROM was fabricated as a semiconductor device.

In this FLASH EPROM, high melting point metal films (the fourth conductor films) 42a and 42b were formed on the control gate electrode 31a and the gate electrode 28b. Thus, the electrical resistance value could be decreased even more.

Note that, here, the high melting point metal films (the fourth conductor films) 42a and 42b were used as the high melting point metal film (the fourth conductor film). However, a high melting point metal silicide film such as a titanium silicide (TiSi) film or the like may be used.

Figure 32:
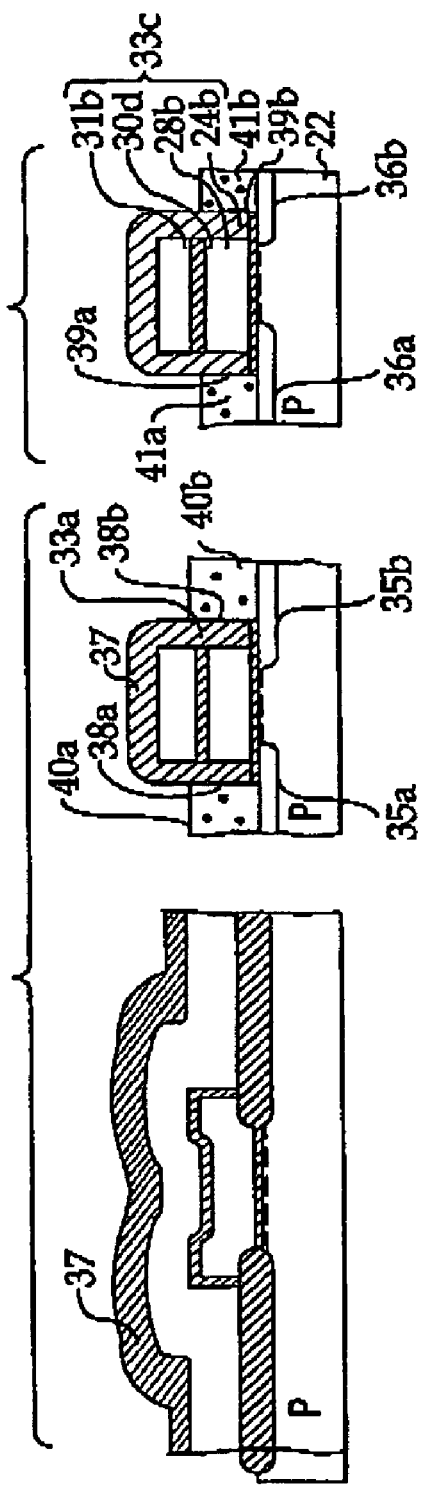
FIG. 32 is a cross-sectional schematic diagram for explaining the process for producing the FLASH EPROM which is yet another example of the process for producing a semiconductor device according to the present invention.
Figure 33:
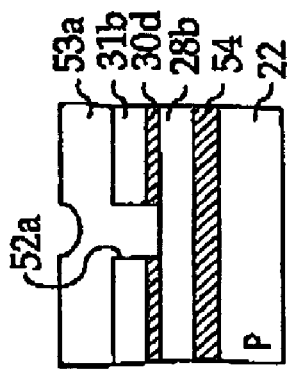
FIG. 33 is a cross-sectional schematic diagram for explaining the process for producing the FLASH EPROM which is yet another example of the process for producing a semiconductor device according to the present invention, and showing a step after the step shown in FIG. 32.
Figure 34:
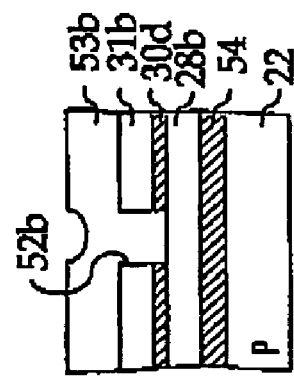
FIG. 34 is a cross-sectional schematic diagram for explaining the process for producing the FLASH EPROM which is yet another example of the process for producing a semiconductor device according to the present invention, and showing a step after the step shown in FIG. 33.

The example of fabricating a FLASH EPROM shown in FIGS. 32 to 34 is the same as the above described example, except that a second gate portion 33c of the peripheral circuit portion (the second element region) (the right side in FIG. 32) also has the structure of the first polysilicon film 28b (first conductor film)/an SiO₂ film 30d (capacitor insulating film)/a second polysilicon film 31b (second conductor film) in the same way as the first gate portion 33a of the memory cell portion (the first element region) (the left side and center in FIG. 32), and that the first polysilicon film 28b and the second polysilicon film 31b are short-circuited so as to form a gate electrode as shown in FIG. 33 or FIG. 34.

As shown in FIG. 33, opening 52a, which passes through the first polysilicon film 28b (first conductor film)/the SiO₂ film 30d (capacitor insulating film)/the second polysilicon film 31b (second conductor film), is formed at a different place than, for example, a second gate portion 33c shown in FIG. 32, e.g., on insulating film 54. A third conductive film, for example, high melting point metal film 53a such as a W film or a Ti film or the like, is filled in the opening 52a. The first polysilicon film 28b and the second polysilicon film 31b are thereby short-circuited. Further, as shown in FIG. 34, opening 52b, which passes through the first polysilicon film 28b (first conductor film)/the SiO₂ film 30d (capacitor insulating film), is formed. The first polysilicon film 28b, the lower layer, is exposed at the bottom portion of the opening 52b. Thereafter, a third conductive film, for example, high melting point metal film 53b such as a W film or a Ti film or the like, is filled in the opening 52b. The first polysilicon film 28b and the second polysilicon film 31b are thereby short-circuited.

In this FLASH EPROM, the second gate portion 33c of the peripheral circuit portion and the first gate portion 33a of the memory cell portion have the same structure. Thus, the peripheral circuit portion can be formed simultaneously with the formation of the memory cell portion. The fabricating process can thereby be simplified, which is efficient.

Note that the third conductor film 53a or 53b was formed separately from the high melting point metal film (the fourth conductor film) 42. However, they may be formed simultaneously as a common high melting point metal film.

EXAMPLE 4

-Fabricating of Recording Head-

Example 4 relates to fabricating of a recording head as an applied example of the resist pattern of the present invention using the resist pattern thickening material according to the present invention. Note that, in Example 4, resist patterns 102 and 126 which will be described hereinafter are resist patterns which have been thickened by the same process as in Example 1 by using the resist pattern thickening material according to the present invention.

FIGS. 35 to 38 are process diagrams for explaining the fabricating of the recording head.

Figure 35:
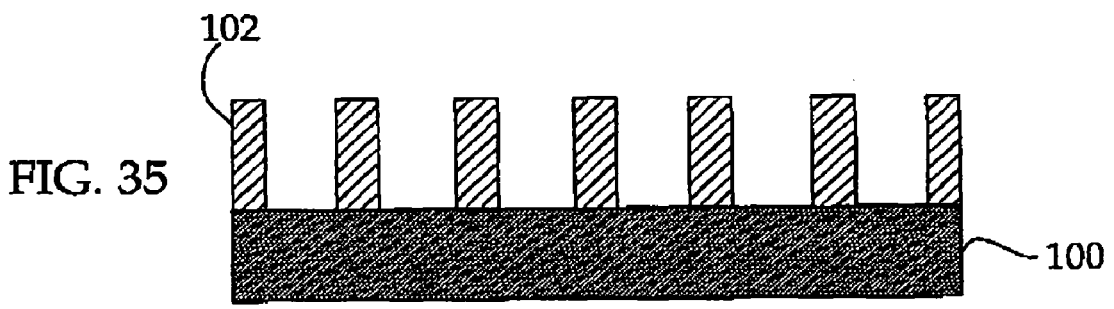
FIG. 35 is a cross-sectional schematic diagram for explaining an example in which a resist pattern, which has been thickened by using the resist pattern thickening material according to the present invention, is applied to the fabricating of a recording head.

First, as shown in FIG. 35, a resist film was formed to a thickness of 6 μm on an interlayer insulating film 100. Exposure and development were carried out, so as to form the resist pattern 102 having an opening pattern for formation of a spiral, thin film magnetic coil.

Figure 36:
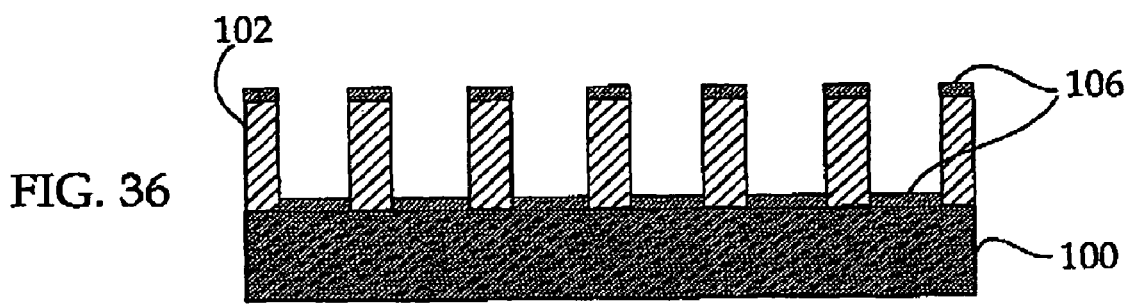
FIG. 36 is a cross-sectional schematic diagram for explaining an example in which a resist pattern, which has been thickened by using the resist pattern thickening material according to the present invention, is applied to the fabricating of a recording head, and showing a step after the step shown in FIG. 35.

Next, as shown in FIG. 36, plating substrate 106 was formed by vapor deposition on the interlayer insulating film 100, both on the resist pattern 102 and on the regions where the resist pattern 102 was not formed, i.e., the exposed surfaces of openings 104. The plating substrate 106 was a laminate of a Ti adhering film having a thickness of 0.01 μm and a Cu adhering film having a thickness of 0.05 μm.

Figure 37:
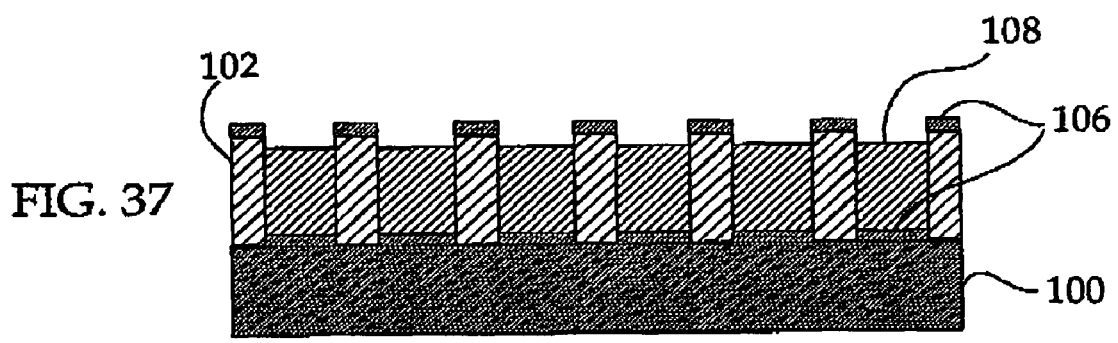
FIG. 37 is a cross-sectional schematic diagram for explaining an example in which a resist pattern, which has been thickened by using the resist pattern thickening material according to the present invention, is applied to the fabricating of a recording head, and showing a step after the step shown in FIG. 36.

Next, as shown in FIG. 37, thin film conductor 108, which was formed by a Cu plating film of a thickness of 3 μm, was formed on the interlayer insulating film 100, at the regions where the resist pattern 102 was not formed, i.e., on the surfaces of the plating substrate 106 formed on the exposed surfaces of the openings 104.

Figure 38:
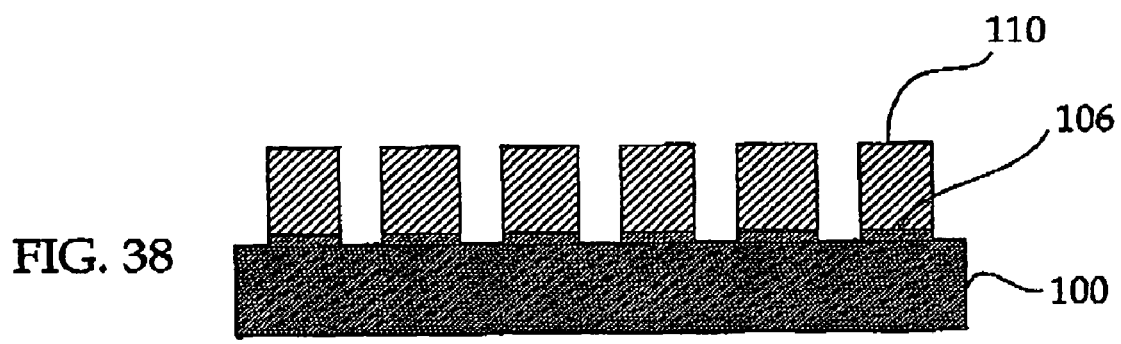
FIG. 38 is a cross-sectional schematic diagram for explaining an example in which a resist pattern, which has been thickened by using the resist pattern thickening material according to the present invention, is applied to the fabricating of a recording head, and showing a step after the step shown in FIG. 37.

Then, as shown in FIG. 38, when the resist pattern 102 was melted and removed and lifted off from the interlayer insulating film 100, thin film magnetic coil 110, which was formed by the spiral pattern of the thin film conductor 108, was formed.

The recording head was thereby fabricated.

At the obtained recording head, the spiral pattern was formed to be fine by the resist pattern 102 that was thickened by using the resist pattern thickening material according to the present invention. Thus, the thin film magnetic coil 110 was fine and detailed, and was extremely well suited to mass production.

FIGS. 39 to 44 are process diagrams for explaining fabrication of another recording head.

Figure 39:
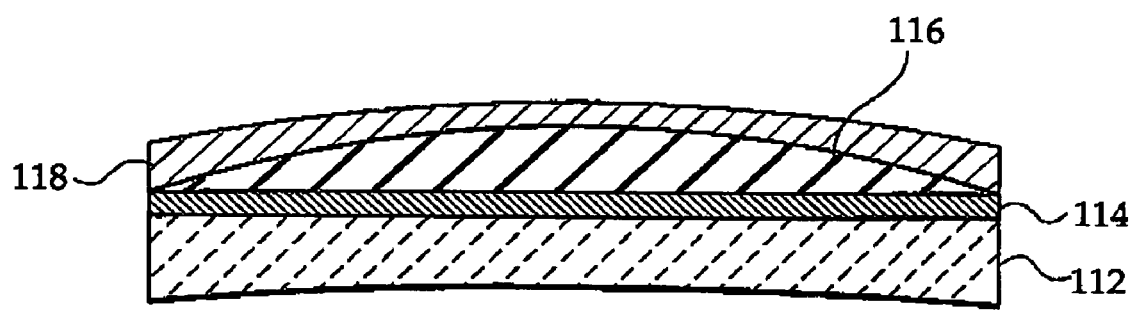
FIG. 39 is a cross-sectional schematic diagram for explaining an example in which a resist pattern, which has been thickened by using the resist pattern thickening material according to the present invention, is applied to the fabricating of a recording head, and showing a step after the step shown in FIG. 38.

As shown in FIG. 39, gap layer 114 was formed by a sputtering method to cover non-magnetic substrate 112 formed of ceramic. Note that an insulator layer (not shown) formed of silicon oxide and a conductive substrate and the like (not shown) formed of an Ni—Fe permalloy were formed in advance by a sputtering method to cover the non-magnetic substrate 112, and a lower portion magnetic layer (not shown) formed of an Ni—Fe permalloy was additionally formed on the non-magnetic substrate 112. Then, resin insulating film 116, which was formed by a thermosetting resin, was formed on predetermined regions on the gap layer 114, except for the portions which were to become the magnetic distal end portions of the aforementioned lower portion magnetic layer (not shown). Next, a resist material was applied on the resin insulating film 116 so as to form resist film 118.

Figure 40:
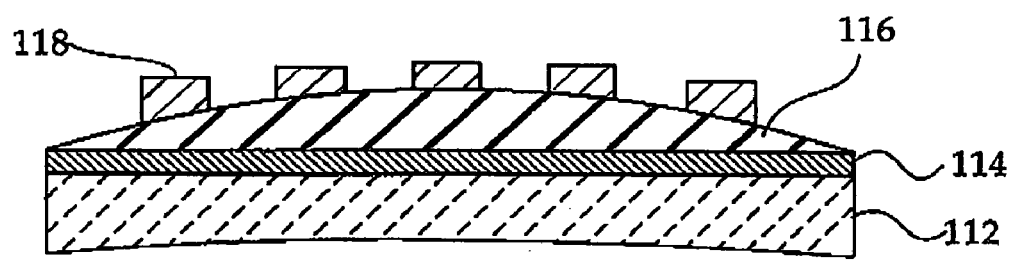
FIG. 40 is a cross-sectional schematic diagram for explaining an example in which a resist pattern, which has been thickened by using the resist pattern thickening material according to the present invention, is applied to the fabricating of a recording head, and showing a step after the step shown in FIG. 39.
Figure 41:
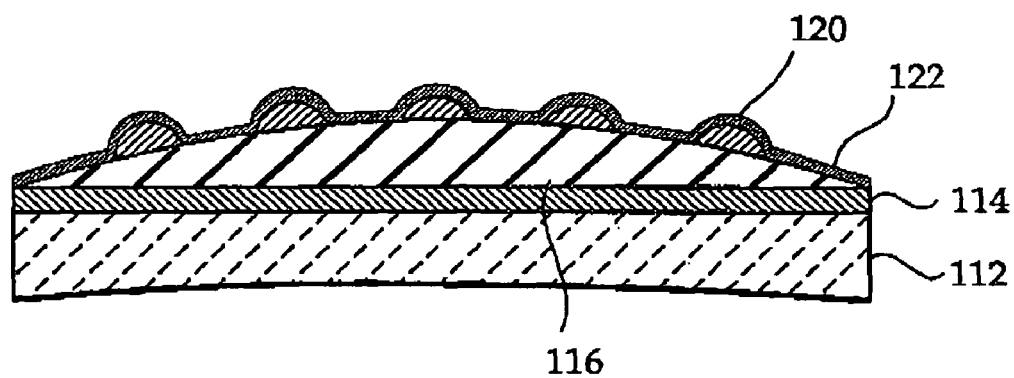
FIG. 41 is a cross-sectional schematic diagram for explaining an example in which a resist pattern, which has been thickened by using the resist pattern thickening material according to the present invention, is applied to the fabricating of a recording head, and showing a step after the step shown in FIG. 40.

Then, as shown in FIG. 40, the resist film 118 was exposed and developed, such that a spiral pattern was formed. Subsequently, as shown in FIG. 41, the resist film 118 of the spiral pattern was subjected to thermosetting processing for about one hour at a temperature of several hundred degrees Celsius, such that first spiral pattern 120, which was shaped as projections, was formed. Then, conductive substrate 122 formed of Cu was formed to cover the surface of the first spiral pattern 120.

Figure 42:
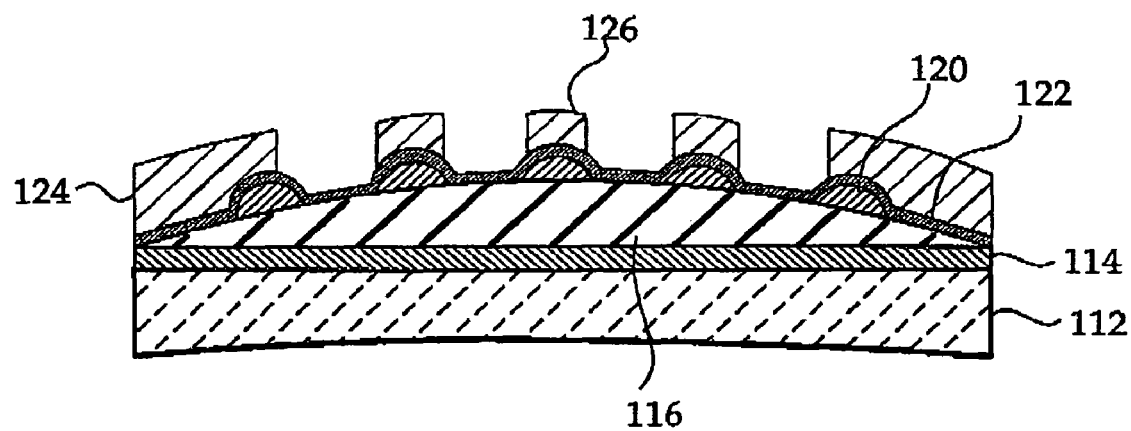
FIG. 42 is a cross-sectional schematic diagram for explaining an example in which a resist pattern, which has been thickened by using the resist pattern thickening material according to the present invention, is applied to the fabricating of a recording head, and showing a step after the step shown in FIG. 41.

Next, as shown in FIG. 42, a resist material was coated on the conductive substrate 122 by a spin coating method so as to form a resist film 124. Thereafter, the resist film 124 was patterned on the first spiral pattern 120, such that the resist pattern 126 was formed.

Figure 43:
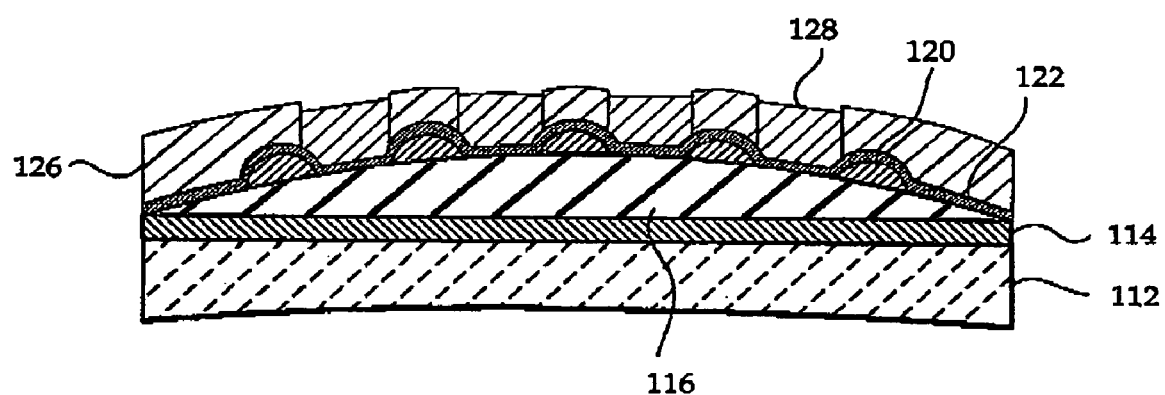
FIG. 43 is a cross-sectional schematic diagram for explaining an example in which a resist pattern, which has been thickened by using the resist pattern thickening material according to the present invention, is applied to the fabricating of a recording head, and showing a step after the step shown in FIG. 42.
Figure 44:
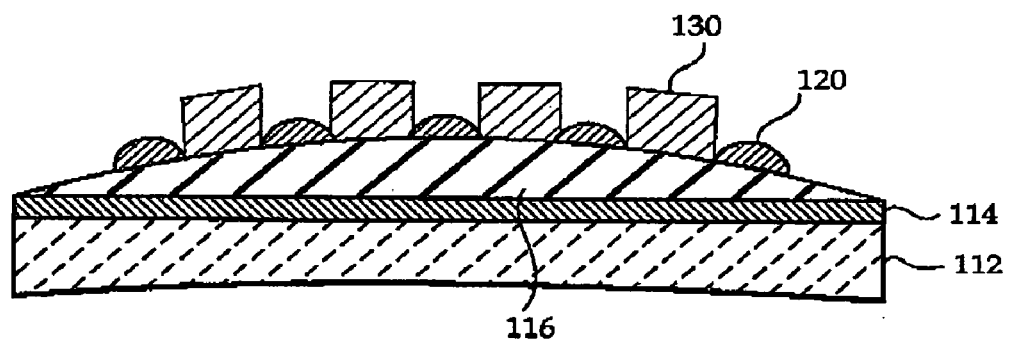
FIG. 44 is a cross-sectional schematic diagram for explaining an example in which a resist pattern, which has been thickened by using the resist pattern thickening material according to the present invention, is applied to the fabricating of a recording head, and showing a step after the step shown in FIG. 43.

Then, as shown in FIG. 43, Cu conductor layer 128 was formed by a plating method on the exposed surface of the conductive substrate 122, i.e., at the regions where the resist pattern 126 was not formed. Thereafter, as shown in FIG. 44, by dissolving and removing the resist pattern 126, the resist pattern 126 was lifted-off from the conductive substrate 122, such that a spiral, thin film magnetic coil 130 formed of the Cu conductor layer 128 was formed.

Figure 45:
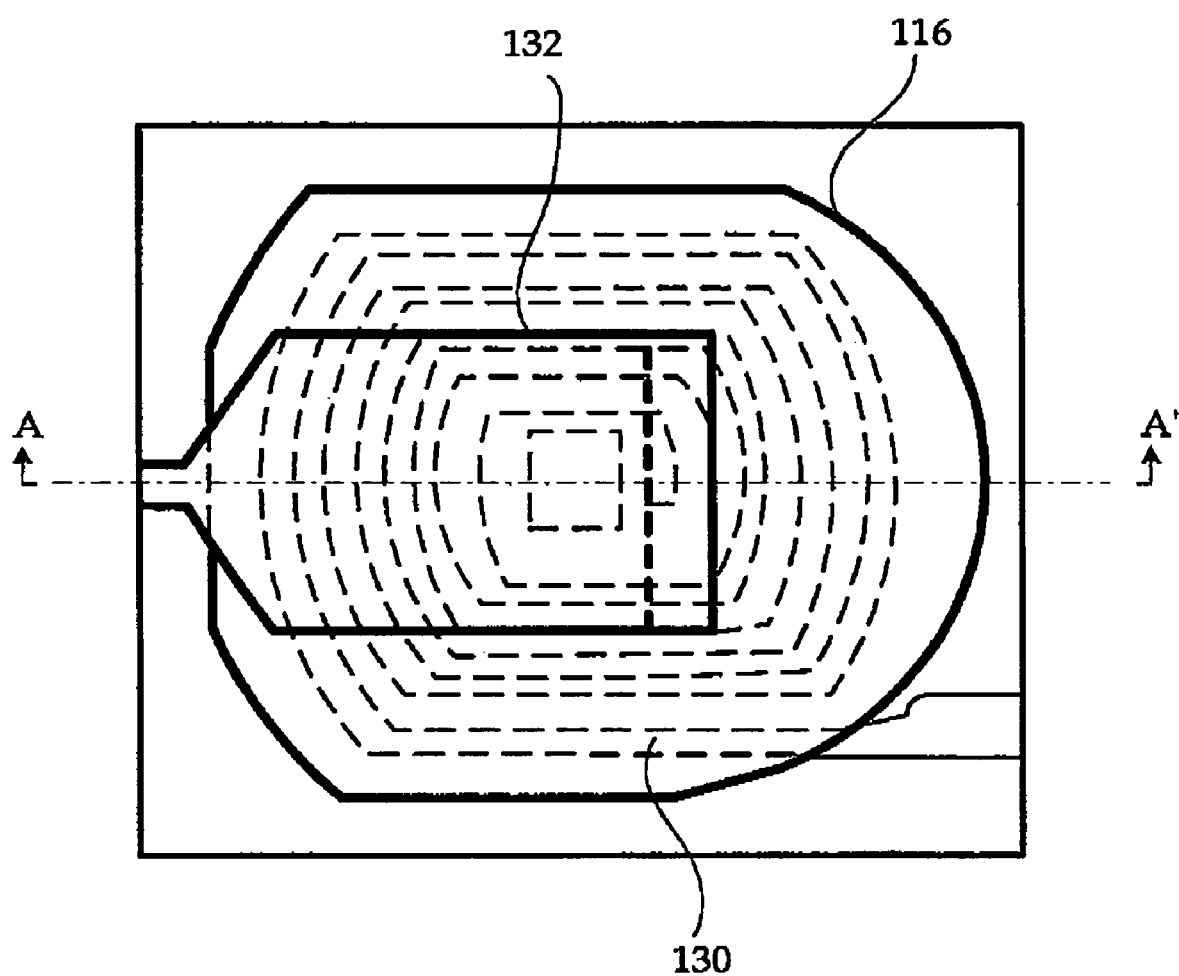
FIG. 45 is a plan view showing an example of the recording head fabricated by the processes of FIGS. 35 to 44.

In this way, a recording head, such as that shown in plan view in FIG. 45, was fabricated which had magnetic layer 132 on the resin insulating film 116 and had the thin film magnetic coil 130 on the surface.

At the obtained magnetic head, the spiral pattern was formed to be fine by the resist pattern 126 that was thickened by using the resist pattern thickening material according to the present invention. Therefore, the thin film magnetic coil 130 was fine and detailed, and was extremely well suited to mass production.

The present invention enables to solve the conventional problems and obtain following features.

Namely, the present invention provides a resist pattern thickening material which, during patterning a resist pattern to be thickened, can utilize laser or light as an irradiation source, and which can thicken a resist pattern formed of ArF resist or the like, and which has excellent mass productivity, and which can finely form a space pattern or wiring pattern, exceeding the exposure limits of irradiation sources. Thus the resist pattern thickening material according to the present invention is suitably applicable for a process for forming a resist pattern and process for producing a semiconductor device according to the present invention.

The process for forming a resist pattern according to the present invention is suitably applicable for functional parts such as a mask pattern, reticle pattern, magnetic head, LCD (liquid crystalline display), PDP (plasma display panel), SAW filter (surface acoustic wave filter) and the like, optical parts used for connecting to an optical wiring, fine pats such as micro actuator and the like, and for producing a semiconductor. The process for forming a resist pattern thickening material according to the present invention is suitably utilized for a process for producing a semiconductor device according to the present invention.

The process for producing a semiconductor according to the present invention is suitably applicable for a producing procedure of various semiconductor devices, such as flash memory, DRAM, FRAM and the like.

In accordance with the present invention, various problems may be solved that have been demanded in the art.

Namely, in accordance with the present invention, a resist pattern thickening material may be provided that exhibits superior storage stability and thickens a resist pattern uniformly, constantly and precisely, without being effected substantially by environmental changes such as temperatures and humidity, and storage period.

Further, in accordance with the present invention, a process for forming a resist pattern is provided that is capable to utilize excimer laser beam, the thickening level of the resist pattern is controllable uniformly, constantly and precisely, without being effected substantially by environmental changes such as temperatures and humidity, and storage period, and space pattern of resist may be formed with a fineness exceeding exposure limits or resolution limits of available irradiation sources.

Further, in accordance with the present invention, a semiconductor device having a fine wiring pattern is provided that is formed using a fine space pattern of resist that is formed using the resist pattern thickening material according to the present invention, and a process for producing a semiconductor device adapted to effective mass production of the semiconductor device.

What is claimed is:

1. A process for forming a resist pattern, comprising:
   forming a resist pattern, and
   coating a resist pattern thickening material on the resist pattern to thicken the resist pattern,
   wherein the resist pattern thickening material comprises a resin, is capable of thickening the resist pattern by coating on the resist pattern, and exhibits a pH value of above 7 and not over 14 at coating on the resist pattern or after coating on the resist pattern, wherein the content of the resin is 2.5% by mass to 3.2% by mass, wherein the resist pattern thickening material further comprises a basic substance, wherein the basic substance comprises a basic compound, and wherein the basic compound is at least one selected from the group consisting of succinimide and cyclohexane carboxyamide.

2. The process for forming a resist pattern according to claim 1, wherein the resist pattern exhibits a pH value of below 7 prior to thickening.

3. The process for forming a resist pattern according to claim 1, wherein the resist pattern is formed from at least one of an ArF resist and a resist containing acrylic resin.

4. The process for forming a resist pattern according to claim 1, wherein the resist pattern is subjected to baking under vacuum, prior to coating the resist pattern thickening material on the surface of the resist pattern.

5. A process for producing a semiconductor device, comprising:
   forming a resist pattern on a surface of workpiece,
   coating a resist pattern thickening material on the resist pattern to thicken the resist pattern to form a thickened resist pattern, and
   patterning the surface of workpiece by etching using the thickened resist pattern as a mask,
   wherein the resist pattern thickening material comprises a resin, is capable of thickening the resist pattern by coating on the resist pattern, and exhibits a pH value of above 7 and not over 14 at coating on the resist pattern or after coating on the resist pattern, wherein the content of the resin is 2.5% by mass to 3.2% by mass, wherein the resist pattern thickening material further comprises a basic substance, wherein the basic substance comprises a basic compound, and wherein the basic compound is at least one selected from the group consisting of succinimide and cyclohexane carboxyamide.

6. The process for producing a semiconductor device according to claim 5, wherein the surface of workpiece is a surface of a semiconductor substrate.

7. A semiconductor device, wherein the semiconductor device is produced by forming a resist pattern on a surface of workpiece, coating a resist pattern thickening material on the resist pattern, thickening the resist pattern to form a thickened resist pattern, and patterning the surface of workpiece by etching using the thickened resist pattern as a mask, and
   wherein the resist pattern thickening material comprises a resin, is capable of thickening the resist pattern by coating on the resist pattern, and exhibits a pH value of above 7 and not over 14 at coating on the resist pattern or after coating on the resist pattern, wherein the content of the resin is 2.5% by mass to 3.2% by mass, wherein the resist pattern thickening material further comprises a basic substance, wherein the basic substance comprises a basic compound, and wherein the basic compound is at least one selected from the group consisting of succinimide and cyclohexane carboxyamide.

8. A process for forming a resist pattern, comprising:
  forming a silicon oxide layer over a semiconductor substrate on which an element region is formed,
  forming a resist pattern on the silicon oxide layer, and
  coating a resist pattern thickening material on the resist pattern to thicken the resist pattern,
wherein the resist pattern thickening material comprises a resin, is capable of thickening the resist pattern by coating on the resist pattern, and exhibits a pH value of above 7 and not over 14 at coating on the resist pattern or after coating on the resist pattern, wherein the content of the resin is 2.5% by mass to 3.2% by mass, wherein the resist pattern thickening material further comprises a basic substance, wherein the basic substance comprises a basic compound, and wherein the basic compound is at least one selected from the group consisting of succinimide and cyclohexane carboxyamide.

* * * * *